(12) United States Patent
Hou et al.

(10) Patent No.: US 11,101,260 B2
(45) Date of Patent: Aug. 24, 2021

(54) METHOD OF FORMING A DUMMY DIE OF AN INTEGRATED CIRCUIT HAVING AN EMBEDDED ANNULAR STRUCTURE

(71) Applicant: Taiwan Semiconductor Manufacturing Company, Ltd., Hsinchu (TW)

(72) Inventors: Shang-Yun Hou, Jubei (TW); Sung-Hui Huang, Dongshan Township (TW); Kuan-Yu Huang, Taipei (TW); Hsien-Pin Hu, Zhubei (TW); Yushun Lin, Taipei (TW); Heh-Chang Huang, Hsinchu (TW); Hsing-Kuo Hsia, Jhubei (TW); Chih-Chieh Hung, Hsinchu (TW); Ying-Ching Shih, Hsinchu (TW); Chin-Fu Kao, Taipei (TW); Wen-Hsin Wei, Hsinchu (TW); Li-Chung Kuo, Taipei (TW); Chi-Hsi Wu, Hsinchu (TW); Chen-Hua Yu, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 376 days.

(21) Appl. No.: 16/051,848

(22) Filed: Aug. 1, 2018

(65) Prior Publication Data

US 2019/0237454 A1    Aug. 1, 2019

Related U.S. Application Data

(60) Provisional application No. 62/625,062, filed on Feb. 1, 2018.

(51) Int. Cl.
*H01L 25/00*    (2006.01)
*H01L 25/065*   (2006.01)
(Continued)

(52) U.S. Cl.
CPC .......... *H01L 25/50* (2013.01); *H01L 21/4803* (2013.01); *H01L 21/4853* (2013.01);
(Continued)

(58) Field of Classification Search
CPC . H01L 25/50; H01L 21/4803; H01L 21/4853; H01L 23/24; H01L 23/3128;
(Continued)

(56) References Cited

U.S. PATENT DOCUMENTS 8,541,886 B2 *  9/2013  Chin .................... H01L 21/6835
                                                    257/777
8,692,388 B2 *  4/2014  Lee ..................... H01L 25/0657
                                                    257/777
(Continued)

FOREIGN PATENT DOCUMENTS

TW    201131715 A    9/2011
TW    201314848 A    4/2013

*Primary Examiner* — Allen L Parker
*Assistant Examiner* — Charles N Ausar-El
(74) *Attorney, Agent, or Firm* — Slater Matsil, LLP

(57) ABSTRACT

An integrated circuit package and a method of forming the same are provided. The method includes attaching an integrated circuit die to a first substrate. A dummy die is formed. The dummy die is attached to the first substrate adjacent the integrated circuit die. An encapsulant is formed over the first substrate and surrounding the dummy die and the integrated circuit die. The encapsulant, the dummy die and the integrated circuit die are planarized, a topmost surface of the encapsulant being substantially level with a topmost surface of the dummy die and a topmost surface of the integrated circuit die. An interior portion of the dummy die is removed. A remaining portion of the dummy die forms an annular structure.

20 Claims, 30 Drawing Sheets

(51) Int. Cl.
*H01L 23/24* (2006.01)
*H01L 23/31* (2006.01)
*H01L 23/498* (2006.01)
*H01L 21/48* (2006.01)
*H01L 25/18* (2006.01)
*H01L 23/00* (2006.01)

(52) U.S. Cl.
CPC .......... *H01L 23/24* (2013.01); *H01L 23/3128* (2013.01); *H01L 23/49827* (2013.01); *H01L 25/0652* (2013.01); *H01L 25/0655* (2013.01); *H01L 25/18* (2013.01); *H01L 24/11* (2013.01); *H01L 24/13* (2013.01); *H01L 24/16* (2013.01); *H01L 24/29* (2013.01); *H01L 24/32* (2013.01); *H01L 24/73* (2013.01); *H01L 24/81* (2013.01); *H01L 24/92* (2013.01); *H01L 24/97* (2013.01); *H01L 2224/0401* (2013.01); *H01L 2224/1144* (2013.01); *H01L 2224/1145* (2013.01); *H01L 2224/11462* (2013.01); *H01L 2224/11464* (2013.01); *H01L 2224/16145* (2013.01); *H01L 2224/16227* (2013.01); *H01L 2224/16235* (2013.01); *H01L 2224/17181* (2013.01); *H01L 2224/32145* (2013.01); *H01L 2224/32225* (2013.01); *H01L 2224/73204* (2013.01); *H01L 2224/73253* (2013.01); *H01L 2224/81191* (2013.01); *H01L 2224/81815* (2013.01); *H01L 2224/92125* (2013.01); *H01L 2224/92225* (2013.01); *H01L 2224/97* (2013.01); *H01L 2225/06513* (2013.01); *H01L 2225/06517* (2013.01); *H01L 2225/06541* (2013.01); *H01L 2924/14* (2013.01); *H01L 2924/1431* (2013.01); *H01L 2924/1432* (2013.01); *H01L 2924/1434* (2013.01); *H01L 2924/1461* (2013.01); *H01L 2924/15311* (2013.01); *H01L 2924/18161* (2013.01)

(58) Field of Classification Search
CPC ........... H01L 23/49827; H01L 25/0652; H01L 25/0655; H01L 25/18; H01L 24/16
See application file for complete search history.

(56) References Cited

U.S. PATENT DOCUMENTS

| | | | |
|---|---|---|---|
| 8,779,599 B2 * | 7/2014 | Lin | H01L 24/94 257/774 |
| 9,093,337 B2 * | 7/2015 | Hwang | H01L 24/03 |
| 9,653,428 B1 * | 5/2017 | Hiner | H01L 25/0655 |
| 9,691,726 B2 * | 6/2017 | Cheng | H01L 24/17 |
| 10,157,881 B2 * | 12/2018 | Hwang | H01L 21/6835 |
| 10,236,224 B2 * | 3/2019 | Kim | H01L 21/67248 |
| 10,937,749 B2 * | 3/2021 | Shih | H01L 23/562 |
| 2005/0048698 A1 * | 3/2005 | Yamaguchi | H01L 23/481 438/109 |
| 2008/0012095 A1 * | 1/2008 | Lee | H01L 25/0657 257/618 |
| 2009/0115042 A1 * | 5/2009 | Koyanagi | H01L 23/295 257/686 |
| 2011/0215470 A1 * | 9/2011 | Chen | H01L 24/97 257/738 |
| 2016/0322330 A1 * | 11/2016 | Lin | H01L 23/5384 |
| 2017/0022051 A1 * | 1/2017 | Xue | B81B 7/0048 |
| 2017/0033080 A1 * | 2/2017 | Chen | H01L 23/3114 |
| 2017/0309603 A1 * | 10/2017 | Chen | H01L 25/50 |
| 2018/0308819 A1 * | 10/2018 | Uzoh | H01L 21/67132 |
| 2019/0279955 A1 * | 9/2019 | Cook | H01L 24/32 |

* cited by examiner

METHOD OF FORMING A DUMMY DIE OF AN INTEGRATED CIRCUIT HAVING AN EMBEDDED ANNULAR STRUCTURE

PRIORITY CLAIM AND CROSS-REFERENCE

This application claims the benefit of U.S. Provisional Application No. 62/625,062, filed on Feb. 1, 2018, entitled "Integrated Circuit Package and Method of Forming Same," which application is hereby incorporated herein by reference in its entirety.

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semi-conductive layers of material over a semiconductor substrate, and patterning the various material layers using lithography to form circuit components and elements thereon. Dozens or hundreds of integrated circuits are typically manufactured on a single semiconductor wafer. The individual dies are singulated by sawing the integrated circuits along scribe lines. The individual dies are then packaged separately, in multi-chip modules, or in other types of packaging.

The semiconductor industry has experienced rapid growth due to continuous improvement in the integration density of a variety of electronic components (e.g., transistors, diodes, resistors, capacitors, etc.). For the most part, this improvement in integration density has come from repeated reductions in minimum feature size (e.g., shrinking the semiconductor process node towards the sub-20 nm node), which allows more components to be integrated into a given area. As the demand for miniaturization, higher speed, and greater bandwidth, as well as lower power consumption and latency has grown recently, there has grown a need for smaller and more creative packaging techniques for semiconductor dies.

As semiconductor technologies further advance, stacked semiconductor devices, e.g., three dimensional integrated circuits (3DICs), have emerged as an effective alternative to further reduce the physical size of semiconductor devices. In a stacked semiconductor device, active circuits such as logic, memory, processor circuits, and the like are fabricated on different semiconductor wafers. Two or more semiconductor wafers may be installed or stacked on top of one another to further reduce the form factor of the semiconductor device. Package-on-package (POP) devices are one type of 3DICs where dies are packaged and are then packaged together with another packaged die or dies. Chip-on-package (COP) devices are another type of 3DICs where dies are packaged and are then packaged together with another die or dies.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
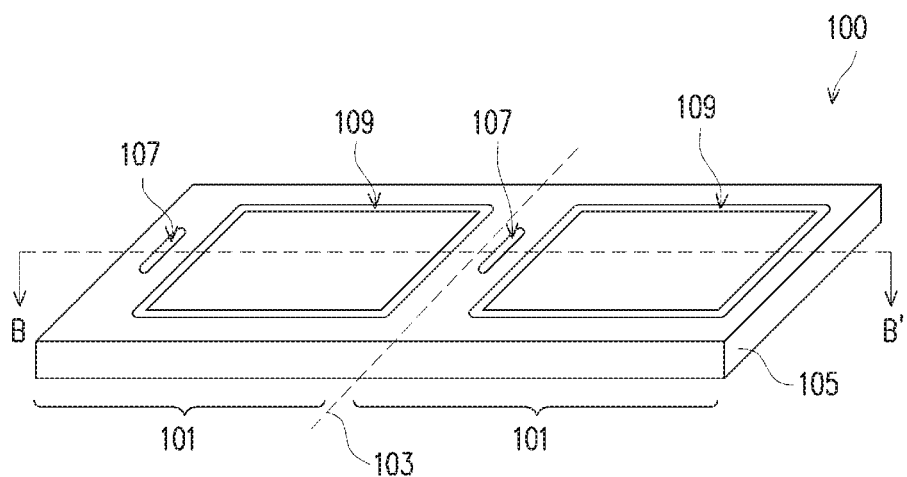
FIGS. 1A, 1B and 2-4 illustrate top and cross-sectional views of various processing steps during fabrication of dummy dies in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments will be described with respect to embodiments in a specific context, namely an integrated circuit package. Other embodiments may also be applied, however, to other electrically connected components, including, but not limited to, package-on-package assemblies, die-to-die assemblies, wafer-to-wafer assemblies, die-to-substrate assemblies, die-to-wafer assemblies, in assembling packaging, in processing substrates, interposers, or the like, or mounting input components, boards, dies or other components, or for connection packaging or mounting combinations of any type of integrated circuit or electrical component. Various embodiments described herein allow for packaging functional components (such as, for example, integrated circuit dies) of varying functionalities and dimensions (such as, for example, heights) in a same integrated circuit package. Various embodiments described herein may be integrated into a chip-on-wafer-on-substrate (CoWoS) process and a chip-on-chip-on-substrate (CoCoS) process.

Figure 1B:
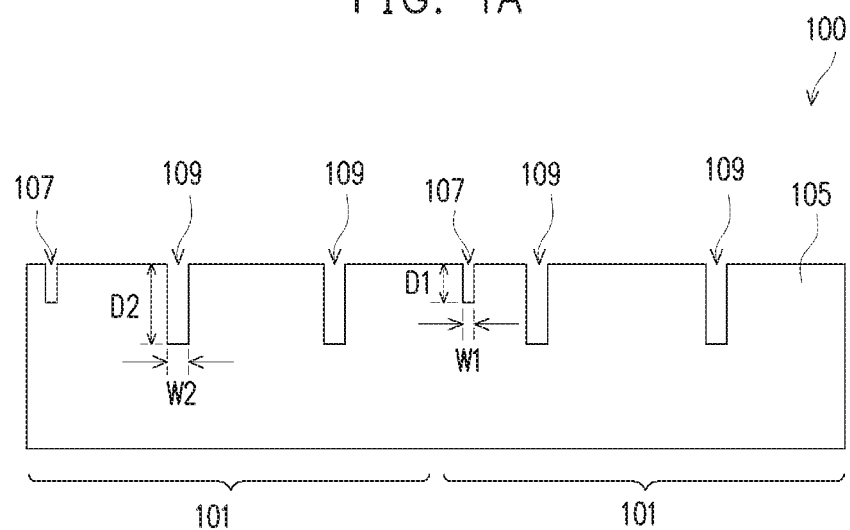

FIGS. 1A, 1B and 2-4 illustrate top and cross-sectional views of various processing steps during fabrication of dummy dies (such as dummy dies 401 illustrated in FIG. 4) in accordance with some embodiments. FIG. 1A illustrates a top view, while FIGS. 1B and 2-4 illustrate cross-section views along a line BB' in FIG. 1A. Referring first to FIGS. 1A and 1B, a portion of a wafer 100 having die regions 101 separated by scribe lines 103 (also referred to as dicing lines or dicing streets) is illustrated. As described below in greater detail, the wafer 100 is diced along the scribe lines 103 to form individual dies (such as dies 401 illustrated in FIG. 4). Furthermore, as described below in greater detail, the individual dies are used as sacrificial or dummy dies, portions of which are removed in subsequent packaging steps. Accordingly, the wafer 100 may not comprise active and passive devices and the individual dies may be functionally inert or dummy dies.

In some embodiments, the wafer 100 comprises a substrate 105. In some embodiments, the substrate 105 may be formed of silicon, although it may also be formed of other group III, group IV, and/or group V elements, such as silicon, germanium, gallium, arsenic, and combinations thereof. The substrate 105 may also be in the form of silicon-on-insulator (SOI). The SOI substrate may comprise a layer of a semiconductor material (e.g., silicon, germanium and/or the like) formed over an insulator layer (e.g., buried oxide and/or the like), which is formed on a silicon substrate. In addition, other substrates that may be used include multi-layered substrates, gradient substrates, hybrid orientation substrates, any combinations thereof and/or the like. In other embodiments, the substrate 105 may comprise a dielectric material such as, for example, an oxide, a nitride, a combination thereof, or the like.

Referring further to FIGS. 1A and 1B, the substrate 105 is patterned to form openings 107 and 109. In some embodiments, the substrate 105 may be patterned using suitable photolithography and etching methods to form the openings 107 and 109. In some embodiments, an etching process used for patterning the openings 107 and 109 may comprise an anisotropic dry etching process, a neutral ion beam process, or the like. In some embodiments, the openings 107 and the opening 109 may be formed simultaneously in a same patterning process. In other embodiments, the openings 107 and the opening 109 may be formed separately at different times in different patterning processes. In some embodiments, the openings 107 may be used as alignment marks during subsequent process steps such as, for example, during the subsequent packaging process. As shown in FIG. 1A, each opening 107 has a rectangular shape. In other embodiments, the openings 107 may have other shapes depending on design requirements for alignment marks. As further shown in FIG. 1A, each opening 109 has an annular shape in a plan view. In the illustrated embodiment, the annular shape of the openings 109 is a rectangular annular shape. In other embodiments, the annular shape of the openings 109 may be a ring, an oval annular shape, a polygonal annular shape, or the like. The openings 107 have a width W1 and extend below a topmost surface of the substrate 105 to a depth D1. The openings 109 have a width W2 and extend below the topmost surface of the substrate 105 to a depth D2. In some embodiments, the width W1 is between about 10 μm and about 30 μm. In some embodiments, the depth D1 is between about 100 μm and about 150 μm. In some embodiments, a ratio W1/D1 is between about 0.1 and about 0.2. In some embodiments, the width W2 is between about 70 μm and about 150 μm. In some embodiments, the depth D2 is between about 200 μm and about 220 μm. In some embodiments, a ratio W2/D2 is between about 0.35 and about 0.7.

Figure 2:
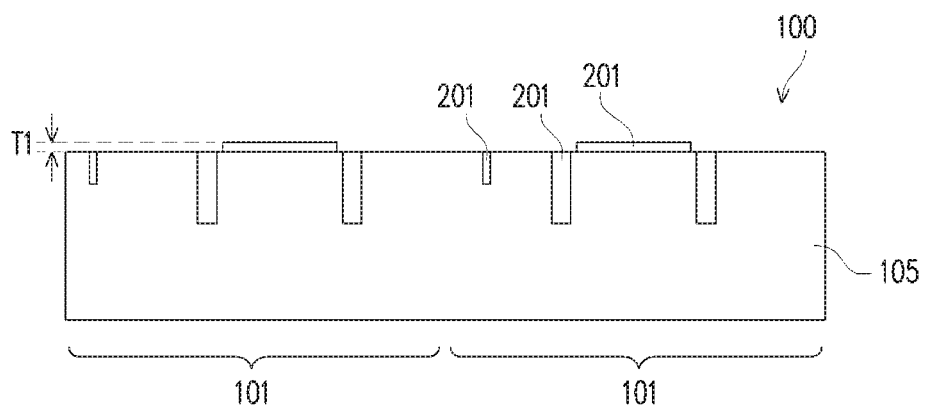

Referring to FIG. 2, an insulating material 201 is formed over the substrate 105 and in the openings 107 and 109 (see FIGS. 1A and 1B). In some embodiments, the insulating material 201 may comprise a non-photo-patternable insulating material, such as silicon nitride, silicon oxide, phosphosilicate glass (PSG), borosilicate glass (BSG), boron-doped phosphosilicate glass (BPSG), a combination thereof, or the like, and may be formed using chemical vapor deposition (CVD), physical vapor deposition (PVD), atomic layer deposition (ALD), a spin-on coating process, a combination thereof, or the like. In other embodiments, the insulating material 201 may comprise a photo-patternable insulating material, such as polybenzoxazole (PBO), polyimide (PI), benzocyclobutene (BCB), a combination thereof, or the like, and may be formed using a spin-on coating process, or the like. In some embodiment, the insulating material 201 is patterned to remove portions of the insulating material 201 from the top surface of the substrate 105. In some embodiments, after the patterning process, unremoved portions of the insulating material 201 remain on portions of the top surface of the substrate 105 surrounded by respective openings 109 (see FIG. 1A). Furthermore, after the patterning process, the insulating material 201 completely fills the openings 107 and 109 (see FIGS. 1A and 1B). In some embodiments where the insulating material 201 comprises a photo-patternable insulating material, the insulating material 201 may be patterned using suitable photolithography techniques. In other embodiments where the insulating material 201 comprises a non-photo-patternable insulating material, the insulating material 201 may be patterned using suitable photolithography and etching techniques. In some embodiments, the unremoved portions of the insulating material 201 on the top surface of the substrate 105 have a thickness T1 between about 5 μm and about 15 μm.

Figure 3:
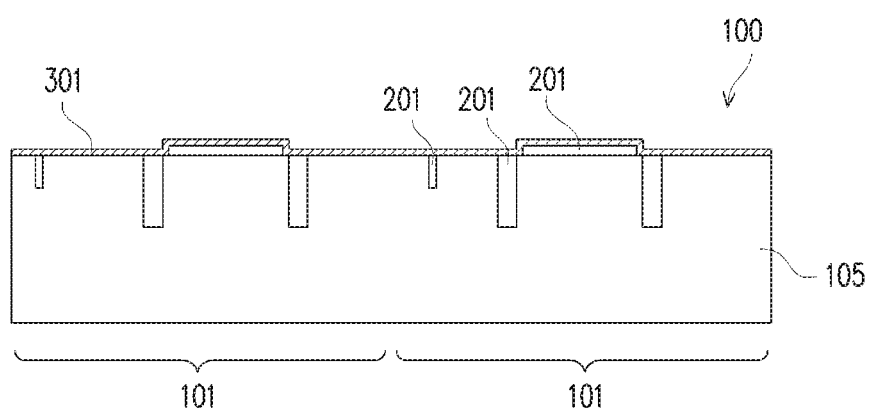

Referring to FIG. 3, a conductive layer 301 is formed over the top surface of the substrate 105 and the remaining portions of the insulating material 201. In some embodiments, the conductive layer 301 may comprise Ti, TiN, Ta, TaN, Cu, a combination thereof, or the like, and may be formed using PVD, ALD, CVD, a combination thereof, or the like. In some embodiments, the conductive layer 301 has a thickness between about 50 nm and about 100 nm. In other embodiments, the conductive layer 301 may be omitted.

Figure 4:
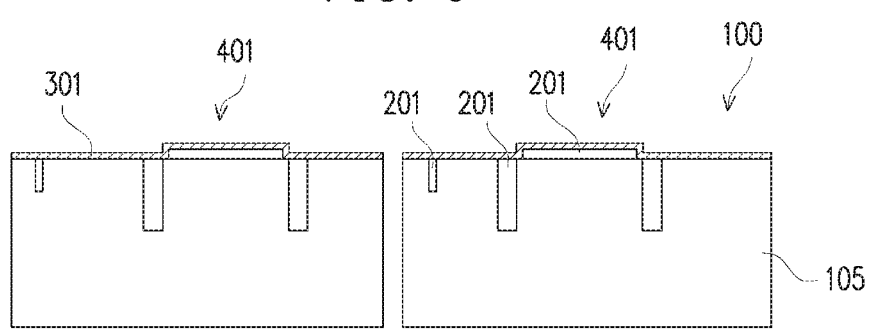

Referring to FIG. 4, the wafer 100 is diced along the scribe lines 103 (see FIG. 1A) to form individual dies 401. In some embodiments, the wafer 100 may be diced using sawing, etching, laser ablation, a combination thereof, or the like. The dies 401 may also be referred to as sacrificial dies or dummy dies.

Figure 5:
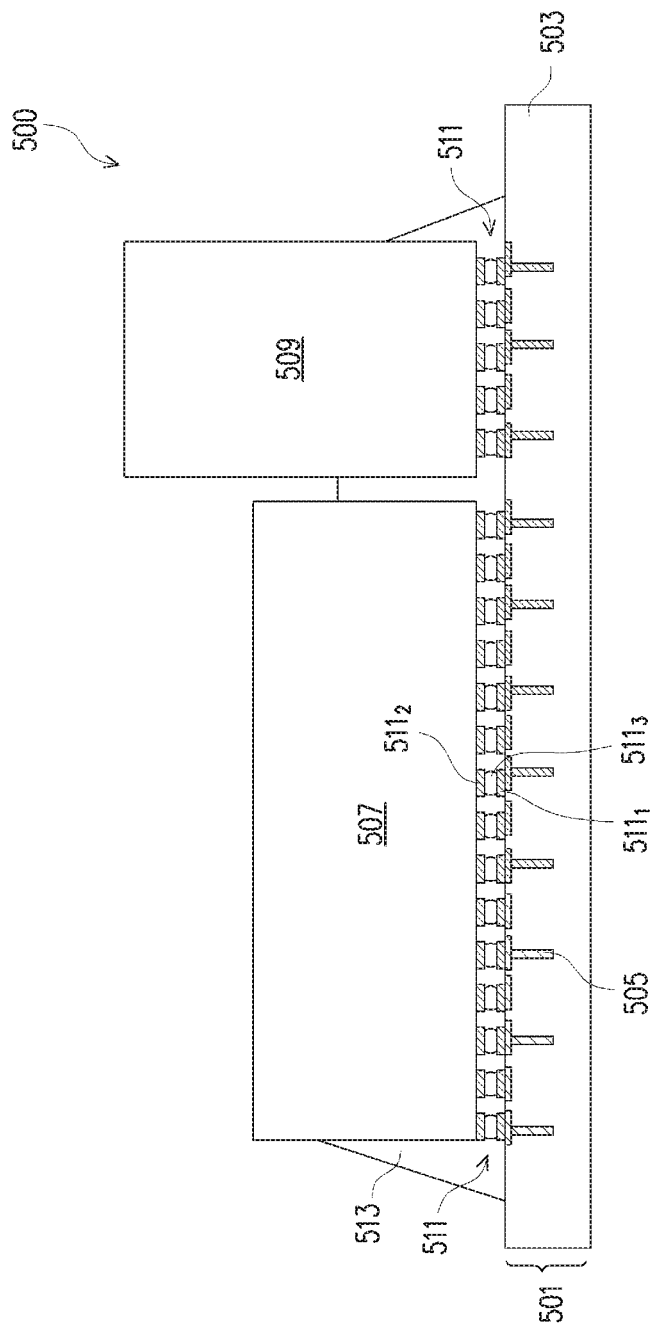
FIGS. 5-11 illustrate cross-sectional views of various processing steps during fabrication of an integrated circuit package in accordance with some embodiments.

FIGS. 5-11 illustrate cross-sectional views of various processing steps during fabrication of an integrated circuit package in accordance with some embodiments. Referring first to FIG. 5, a stacked structure 500 comprising a workpiece 501 and integrated circuit (IC) dies 507 and 509 bonded to a top surface of the workpiece 501 is illustrated. In some embodiments, the workpiece 501 is a wafer, such as an interposer wafer, for example. In such embodiments, the stacked structure 500 is singulated into individual stacked structures. In other embodiments, the workpiece 501 is a singulated die, such as an interposer die, for example. In some embodiments where the workpiece 501 is an interposer wafer or an interposer die, the workpiece 501 comprises a substrate 503 and interconnects, such as through vias (TVs) 505 and lines (not illustrated) within the substrate 503. In some embodiments, the substrate 503 may be formed using similar materials and methods as the substrate 105 described above with reference to FIGS. 1A and 1B, and the description is not repeated herein. In some embodiments, the interconnects may comprise one or more conductive materials, such as copper, a copper alloy, silver, gold, tungsten, tantalum, aluminum, a combination thereof, or the like. In some embodiments, the workpiece 501 may not comprise active and passive devices other than the interconnects.

In some embodiments, each of the IC dies 507 and 509 may comprise a substrate, one or more active and/or passive devices on the substrate, and an interconnect structure over the substrate and the one or more active and/or passive devices (not individually shown). In some embodiments, the substrate of the IC dies 507 and 509 may be formed using similar material and methods as the substrate 105 described above with reference to FIGS. 1A and 1B, and the description is not repeated herein. In some embodiments, the one or more active and/or passive devices of the IC dies 507 and 509 may include various n-type metal-oxide semiconductor (NMOS) and/or p-type metal-oxide semiconductor (PMOS) devices such as transistors, capacitors, resistors, diodes, photo-diodes, fuses and/or the like.

The interconnect structures of IC dies 507 and 509 may comprise a plurality of dielectric layers (such an inter-layer dielectric (ILD)/inter-metal dielectric layers (IMDs)) and interconnects (such as conductive lines and vias) within the dielectric layers. The dielectric layers may be formed, for example, of a low-K dielectric material, such as phosphosilicate glass (PSG), borophosphosilicate glass (BPSG), FSG, SiOxCy, Spin-On-Glass, Spin-On-Polymers, silicon carbon material, compounds thereof, composites thereof, combinations thereof, or the like, by any suitable method known in the art, such as a spin-on coating method, CVD, plasma enhanced CVD (PECVD), a combination thereof, or the like. In some embodiments, interconnects may be formed in the dielectric layers using, for example, a damascene process, a dual damascene process, a combination thereof, or the like. In some embodiments, interconnects may comprise copper, a copper alloy, silver, gold, tungsten, tantalum, aluminum, a combination thereof, or the like. In some embodiments, the interconnects may provide electrical connections between the one or more active and/or passive devices formed on the substrate.

Referring further to FIG. 5, each of the IC dies 507 and 509 may be a memory die, a logic die, a 3DIC die, a CPU, a GPU, an xPU, a SoC die, a MEMS die, or the like. In the illustrated embodiment, the IC dies 507 and 509 have different heights. In other embodiments, the IC dies 507 and 509 may have a same height. In some embodiments, the IC dies 507 and 509 are mechanically and electrically attached to the workpiece 501 using connectors 511. In some embodiments, the connectors 511 may comprise microbumps, solder bumps, metal pillar bumps, other suitable structures, a combination thereof, or the like. In some embodiments, each of the connectors 511 may include a solder element $511_3$ sandwiched between two metal pillar bumps $511_1$ and $511_2$, as shown in FIG. 5. In some embodiments, the metal pillar bumps $511_1$ and $511_2$ may comprise a metallic material such as copper, tungsten, aluminum, silver, gold, a combination thereof, or the like. In some embodiments, the solder elements $511_3$ may comprise lead-based solders such as PbSn compositions, lead-free solders including InSb, tin, silver, and copper ("SAC") compositions, and other eutectic materials that have a common melting point and form conductive solder connections in electrical applications. For lead-free solders, SAC solders of varying compositions may be used, such as SAC 105 (Sn 98.5%, Ag 1.0%, Cu 0.5%), SAC 305, and SAC 405, as examples. Lead-free solders also include SnCu compounds, without the use of silver (Ag), and SnAg compounds, without the use of copper (Cu).

In some embodiments, the metal pillar bumps $511_1$ are formed over the top surface of the workpiece 501 and the metal pillar bumps $511_2$ are formed over bottom surfaces of the IC dies 507 and 509 before bonding the IC dies 507 and 509 to the workpiece 501. Subsequently, a solder material, such as a solder paste, is applied on one or both of the metal pillar bumps $511_1$ and $511_2$ before the bonding process. Afterwards, the metal pillar bumps $511_1$ and $511_2$ are bonded together through the solder material using a reflow process, for example. The solder material forms the solder elements $511_3$ between the metal pillar bumps $511_1$ and $511_2$, as shown in FIG. 5. In some embodiments, a method of forming the metal pillar bumps $511_1$ and $511_2$ may comprise forming a metal seed layer, forming a sacrificial material (such as a photoresist material) over the metal seed layer, patterning the sacrificial material to form openings, depositing a metallic material in the openings using an electrochemical plating process, an electroless plating process, ALD, PVD, a combination thereof, or the like to form metal pillar bumps $511_1$ and $511_2$, removing the sacrificial layer, and removing exposed portions of the seed layer. In some embodiments, before removing the sacrificial layer, a solder material is formed over the metallic material in the openings using evaporation, an electro-chemical plating process, an electroless plating process, printing, solder transfer, a combination thereof, or the like.

In some embodiments, an underfill layer 513 is formed to surround and protect the connectors 511. In some embodiments, the underfill layer 513 is in direct contact with the connectors 511. In some embodiments, a liquid underfill material is dispensed by capillary action and cured to form the underfill layer 513. In some embodiments, the underfill layer 513 includes an epoxy-based resin with fillers dispersed therein. The fillers may include fibers, particles, other suitable elements, a combination thereof, or the like.

Figure 6:
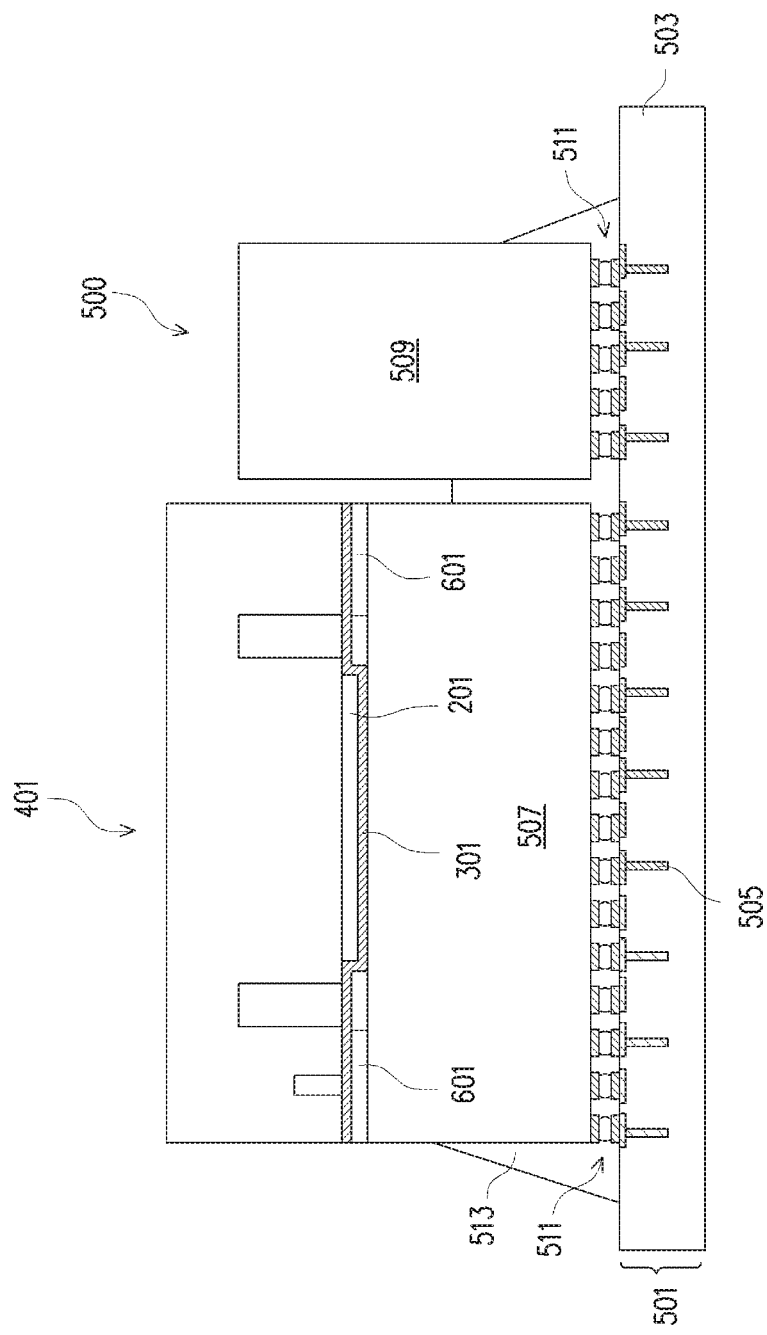

Referring to FIG. 6, the dummy die 401 is attached to the IC die 507. In some embodiments, the dummy die 401 is attached to the IC die 507 using an adhesive 601. In such embodiments, the adhesive 601 is formed on portions of the front surface (a surface facing the IC die 507) of the dummy die 401 free from the insulating material 201. In other embodiments, the dummy die 401 may be attached to the IC die 507 using a direct bonding method, or other suitable bonding methods.

Figure 7:
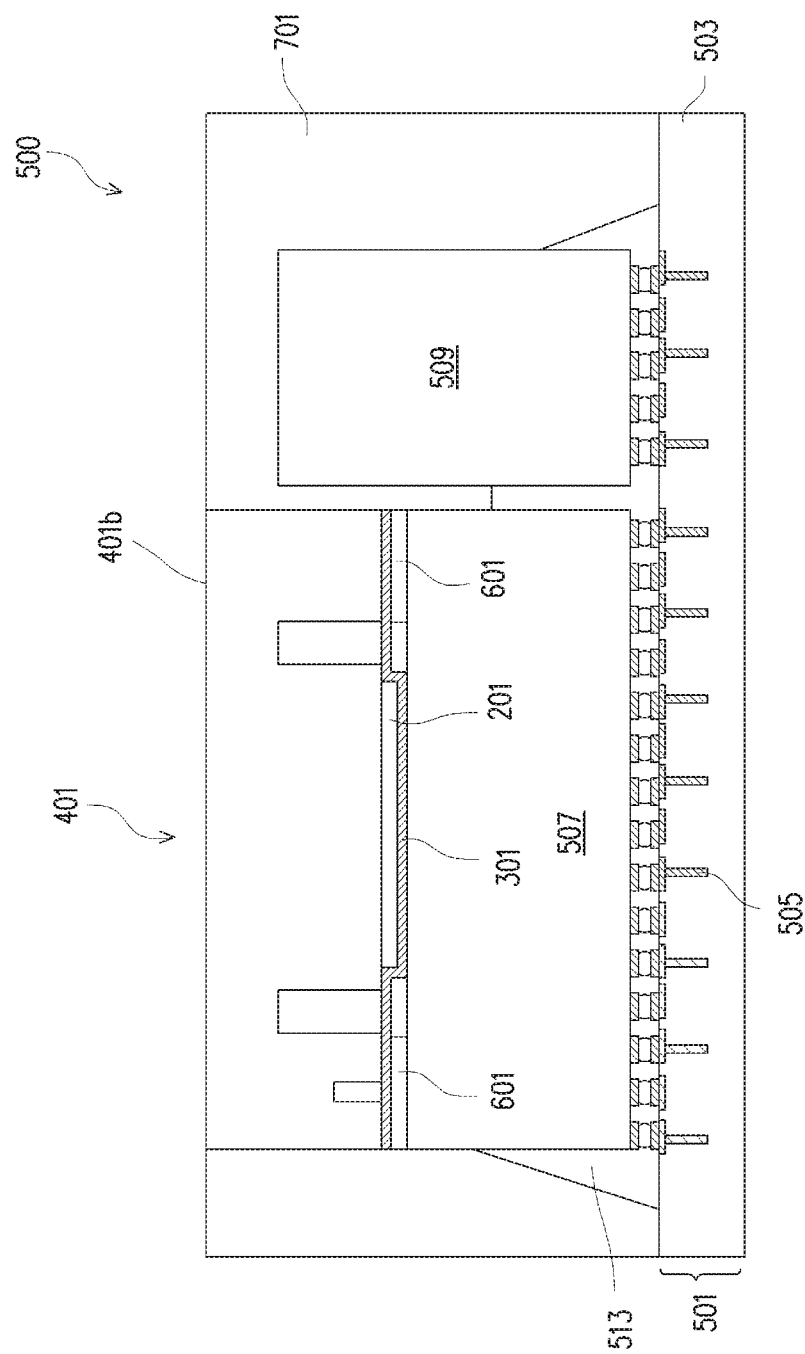

Referring to FIG. 7, an encapsulant 701 is formed over the workpiece 501, and around the IC dies 507 and 509, and the dummy die 401. In some embodiments, the encapsulant 701 may comprise a molding compound, such as an epoxy, a resin, a moldable polymer, a combination thereof, or the like, with fillers dispersed therein. The molding compound may be applied while substantially liquid, and then may be cured through a chemical reaction. The fillers may include insulating fibers, insulating particles, other suitable elements, a combination thereof, or the like. In some embodiments, the size and/or density of the fillers dispersed in the encapsulant 701 is greater than those dispersed in the underfill layer 513. In other embodiments, the encapsulant 701 may be an ultraviolet (UV) or thermally cured polymer applied as a gel or malleable solid capable of being disposed around and between IC dies 507 and 509, and between the IC die 509 the dummy die 401. In yet other embodiments, the encapsulant 701 may comprise a dielectric material, such as an oxide, for example. In some embodiments, a planarization process may be performed on the encapsulant 701 to remove excess portions of the encapsulant 701, such that a topmost surface of the encapsulant 701 is substantially level with a backside surface 401b of the dummy die 401 after the planarization process. In some embodiments, the planarization process may comprise a CMP process, an etching process, grinding, a combination thereof, or the like.

Figure 8:
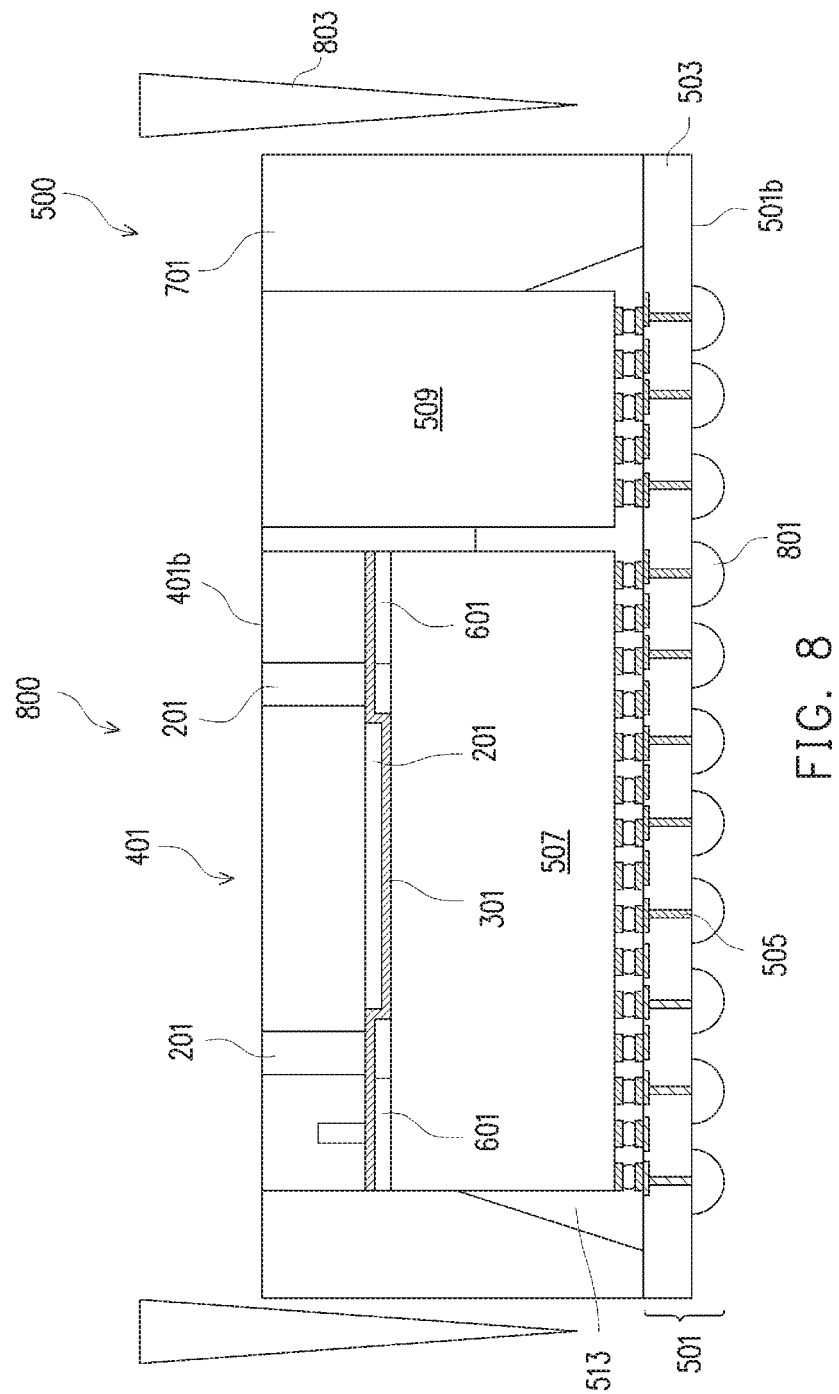

Referring to FIG. 8, a backside 501b of the workpiece 501 is thinned to expose the TVs 505, and conductive connectors 801 are formed on the backside 501b of the workpiece 501 in electrical contact with respective TVs 505. In some embodiments, the backside 501b of the workpiece 501 may be thinned using a CMP process, an etching process, grinding, a combination thereof, or the like. In some embodiments, the connectors 801 may be controlled collapse chip connection ($C_4$) bumps, ball grid array (BGA) bumps, or the like. In some embodiments, the connectors 801 may comprise similar solder materials as the solder elements $511_3$ described above with reference to FIG. 5, and the description is not repeated herein.

Referring further to FIG. 8, after forming the connectors 801, a further planarization process is performed on the dummy die 401 and the encapsulant 701 to expose the insulating material 201 disposed in the openings 109 (see FIGS. 1A and 1B) of the dummy die 401. In some embodiments, the planarization process may also remove a portion of the IC die 509. In some embodiments, the backside surface 401b of the dummy die 401 is substantially level with the top surface of the encapsulant 701 and a top surface of the IC die 509 after the planarization process. In some embodiments, the planarization process may comprise a CMP process, an etching process, grinding, a combination thereof, or the like. In some embodiments, the insulating material 201 disposed in the openings 109 (see FIGS. 1A and 1B) of the dummy die 401 protects the IC die 507 from contamination during the planarization process. In some embodiments where the workpiece 501 is a wafer, a singulation process 803 may be performed on the stacked structure 500 to separate the stacked structure 500 into individual stacked structures 800. The singulation process 803 may comprise sawing, etching, laser ablation, a combination thereof, or the like.

Figure 9:
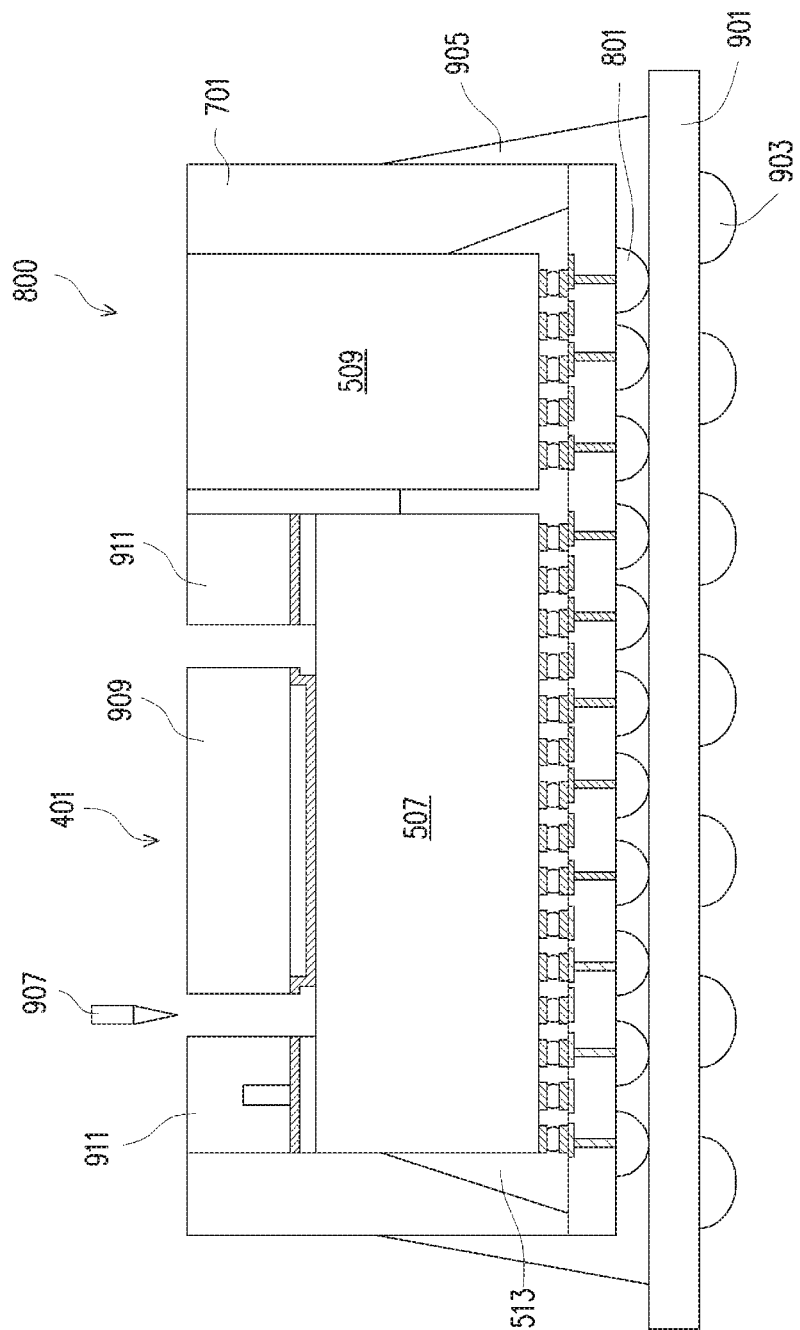

Referring to FIG. 9, the stacked structure 800 is mechanically and electrically attached to a workpiece 901 using the connectors 801. In some embodiments where the connectors 801 are formed of a solder material, a reflow process may be performed to bond the stacked structure 800 to the workpiece 901. In some embodiments, the workpiece 901 may comprise a package substrate, a printed circuit board (PCB), a ceramic substrate, or the like. In some embodiments, the workpiece 901 may comprise interconnects (such as conductive lines and vias) in and/or on the workpiece 901. In some embodiment, connectors 903 are formed on the workpiece 901 on a side opposite from the stacked structure 800. In some embodiments, the connectors 903 may be similar to the connectors 801, may be formed using similar material and methods as described above with reference to FIG. 8, and the description is not repeated herein. In some embodiments, an underfill layer 905 is formed to surround and protect the connectors 801. In some embodiments, the underfill layer 905 may be formed using similar materials and methods as the underfill layer 513 described above with reference to FIG. 5, and the description is not repeated herein.

Referring further to FIG. 9, after attaching the stacked structure 800 to the workpiece 901, the insulating material 201 (see FIG. 8) is removed from the openings 109 (see FIGS. 1A and 1B) of the dummy die 401. In some embodiments, the insulating material 201 is removed using a laser drilling process 907. In other embodiments, the insulating material 201 may be removed using other suitable removal processes, such as an etching process, for example. After removing the insulating material 201, the dummy die 401 is separated into an interior region 909 and an annular region 911.

Figure 10:
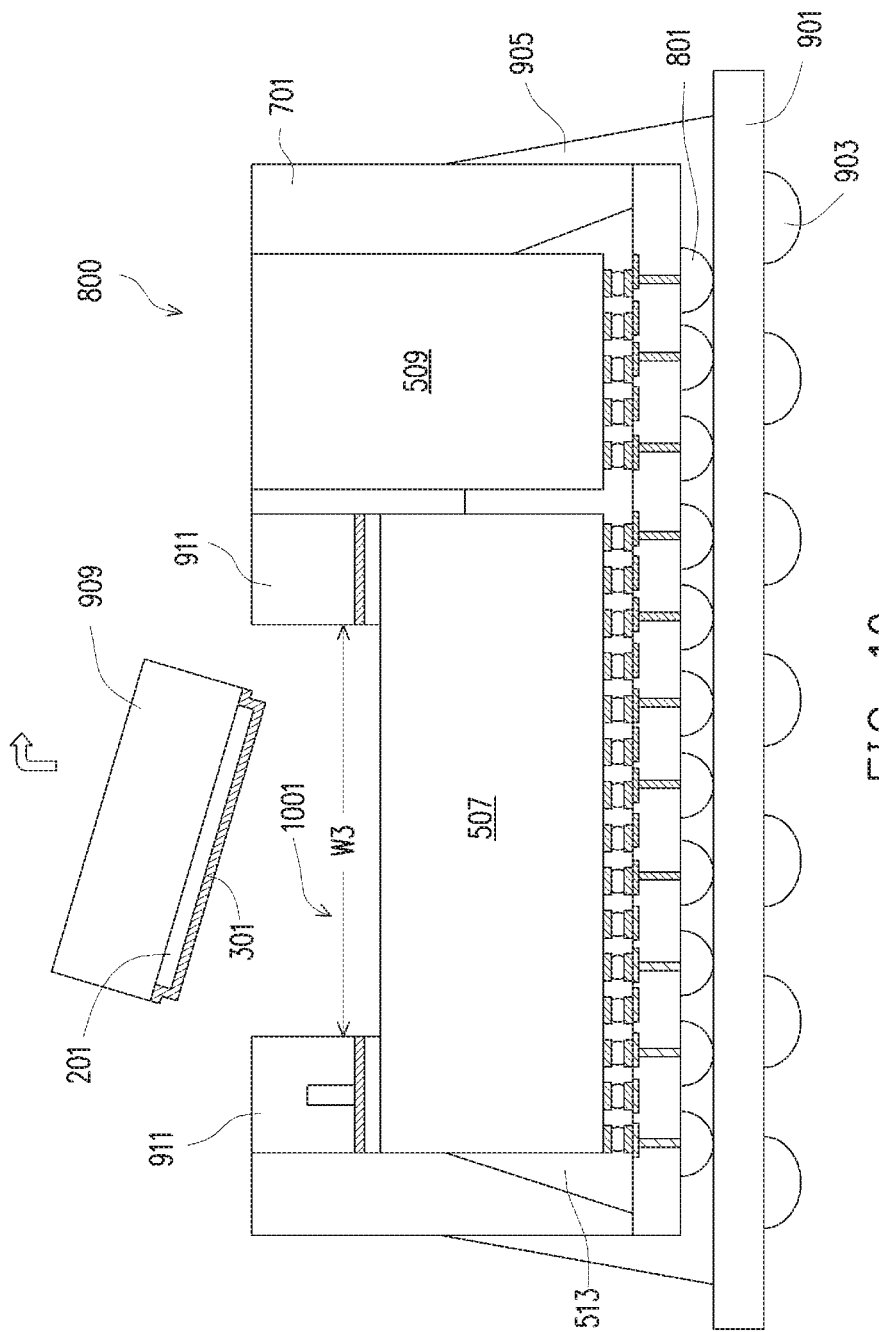

Referring to FIG. 10, the interior region 909 of the dummy die 401 is removed to expose an opening 1001 in the annular region 911 of the dummy die 401. In some embodiments, the interior region 909 of the dummy die 401 is removed using a pick-and-place apparatus. In other embodiments, the interior region 909 of the dummy die 401 may be removed manually or using other suitable removal methods. In some embodiments, the conductive layer 301 may aid the removal process of the interior region 909 by acting as a buffer between the insulating material 201 and the IC die 507 and by preventing bonding between the insulating material 201 and the IC die 507. In some embodiments, the opening 1001 exposes a top surface of the IC die 507. In some embodiments, the openings 1001 have a width W3 between about 1 mm and about 30 mm. In other embodiments, the width W3 may be greater than about 30 mm.

Figure 11:
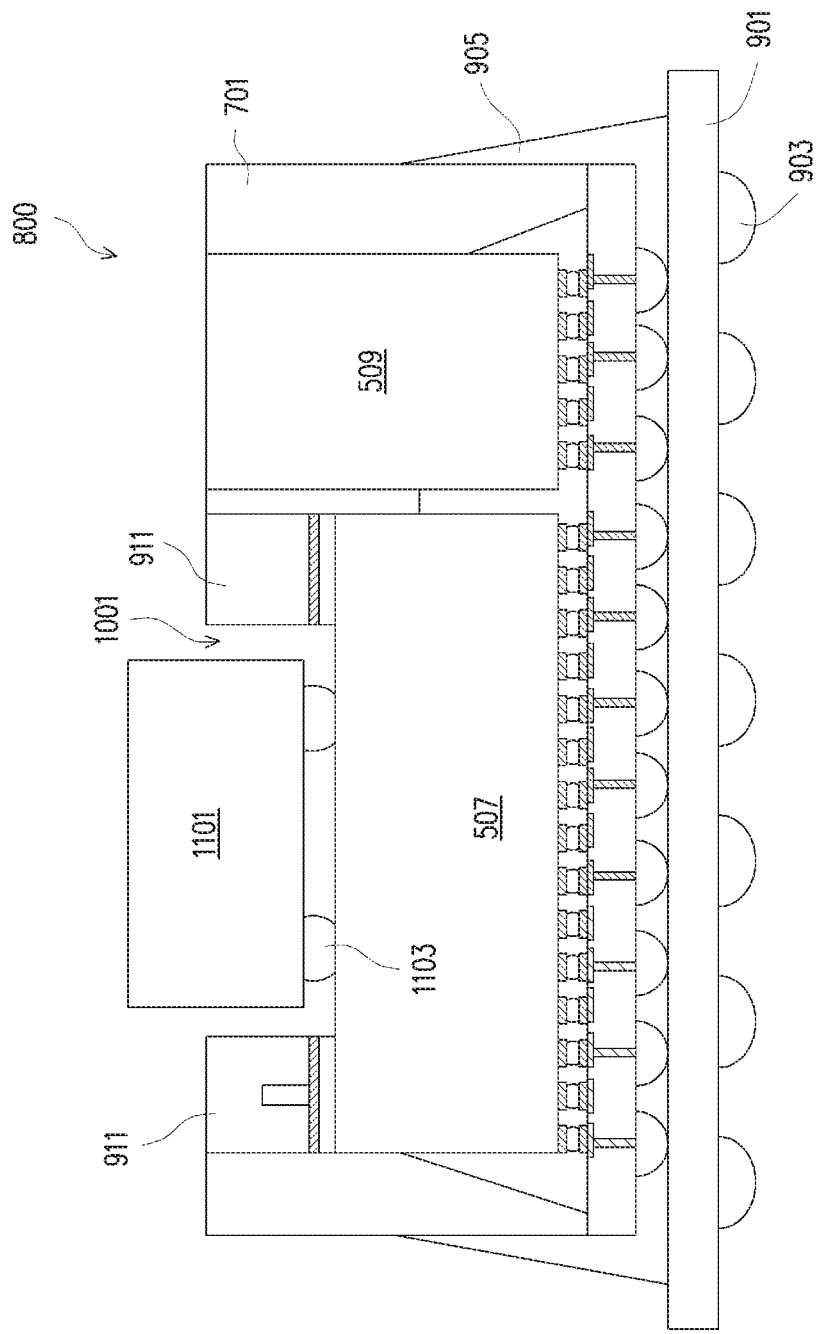

Referring to FIG. 11, a functional component 1101 is placed in the opening 1001 of the annular region 911. In some embodiments, the functional component 1101 may be an IC die similar to the IC dies 507 and 509. In such embodiments, the functional component 1101 may be mechanically and electrically connected to the IC die 507 using connectors 1103. In some embodiments, the connectors 1103 may be formed using similar materials and methods as the connectors 511 described above with reference to FIG. 5, and the description is not repeated herein. In other embodiments, the functional component 1101 may be mechanically and electrically connected to the IC die 507 using a direct bonding method, such as a hybrid bonding method, or the like. In some embodiments wherein the resulting package is used in photonics applications, the functional component 1101 may comprise a photonic fiber module, a laser module package (LaMP), a coupler, or the like. In such embodiments, the functional component 1101 may be attached to the IC die 509 only mechanically.

Figure 12A:
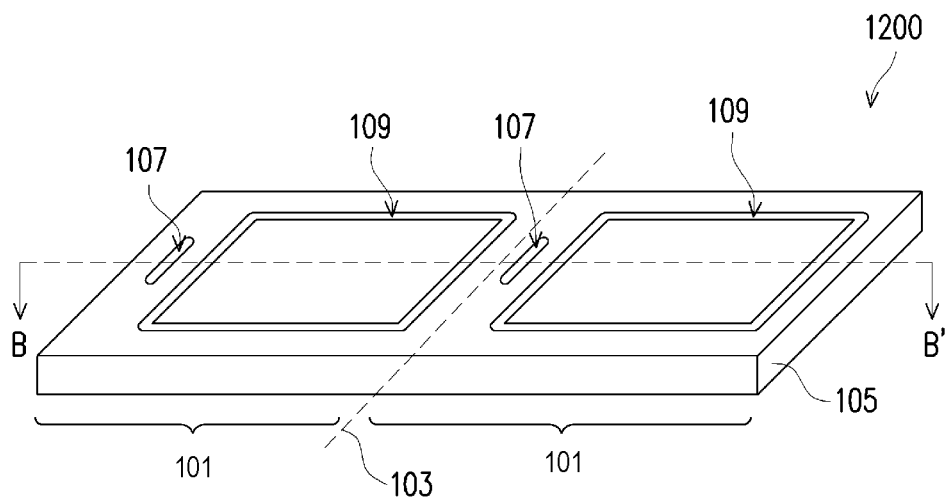
FIGS. 12A, 12B and 13-15 illustrate top and cross-sectional views of various processing steps during fabrication of dummy dies in accordance with some embodiments.
Figure 12B:
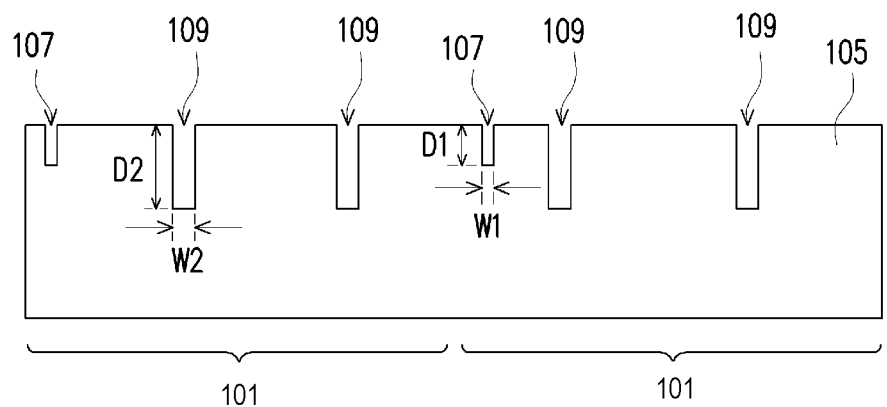
Figure 13:
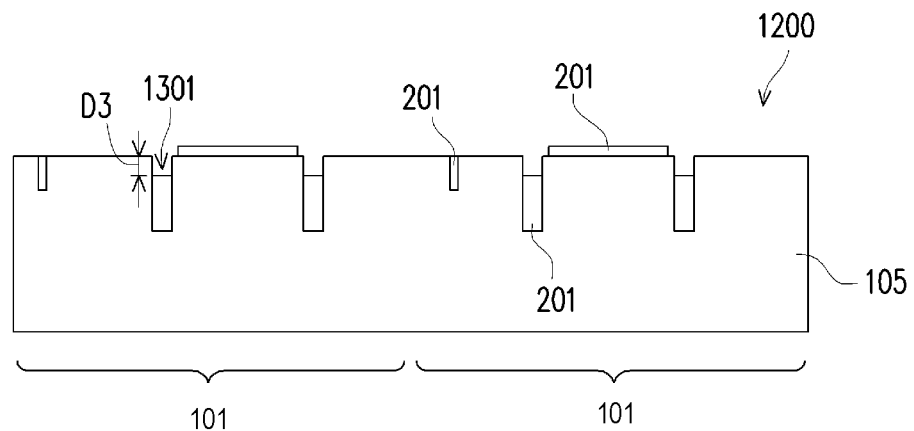
Figure 14:
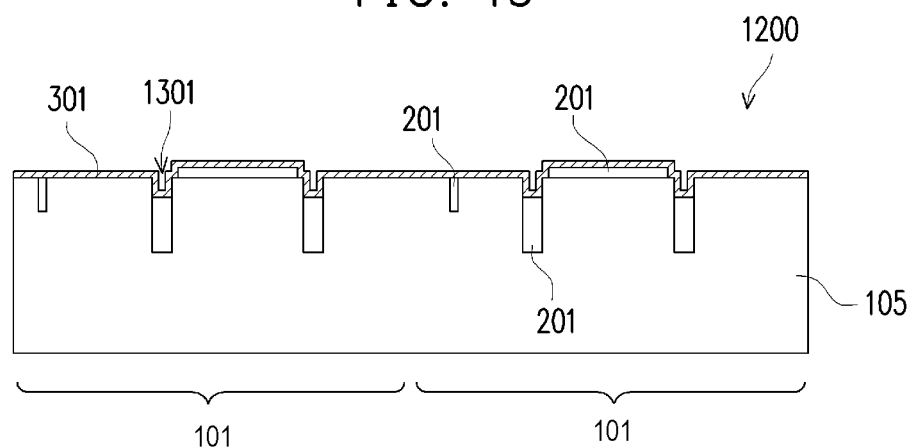
Figure 15:
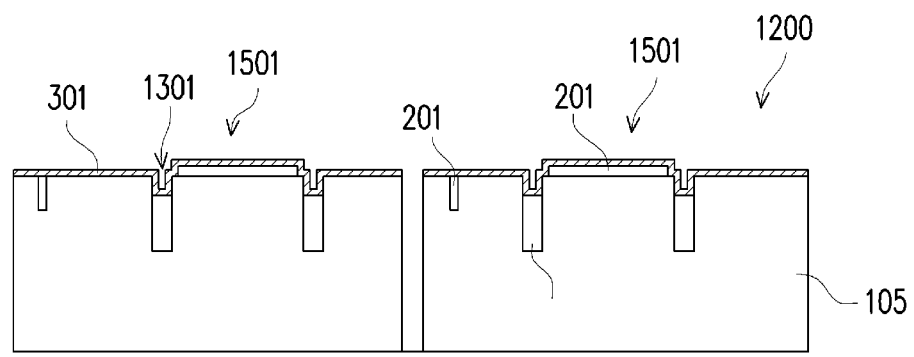

FIGS. 12A, 12B and 13-15 illustrate top and cross-sectional views of various processing steps during fabrication of dummy dies (such as dummy dies 1501 illustrated in FIG. 15) in accordance with some embodiments. FIG. 12A illustrates a top view of a wafer 1200, while FIGS. 12B and 13-15 illustrate cross-section views along a line BB' in FIG. 12A. The embodiment illustrated in FIGS. 12A, 12B and 13-15 is similar to the embodiment illustrated in FIGS. 1A, 1B, and 2-4, with like features being labeled using like numerical references, and the detailed description of the like features and process steps are not repeated herein. In the embodiment illustrated in FIGS. 12A, 12B and 13-15, the patterning process performed on the insulating material 201 also removes portions of the insulating material 201 from the openings 109 (see FIGS. 12A and 12B) to form recesses 1301 as shown in FIG. 13. Accordingly, the dummy dies 1501 formed after dicing the wafer 1200 comprise the recesses 1301 with the conductive layer 301 extending along bottoms and sidewalls of the recesses 1301 as shown in FIG. 15. In some embodiments, the recesses 1301 have a depth D3 between about 10 μm and about 50 μm.

Figure 16A:
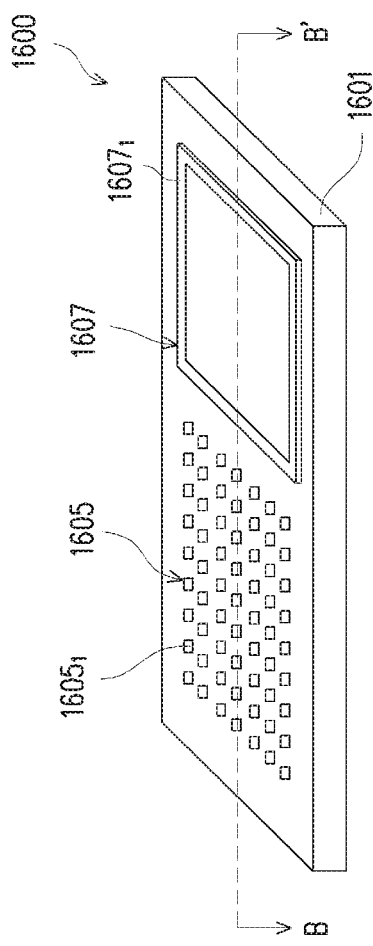
FIGS. 16A, 16B and 17-24 illustrate top and cross-sectional views of various processing steps during fabrication of an integrated circuit package in accordance with some embodiments.
Figure 16B:
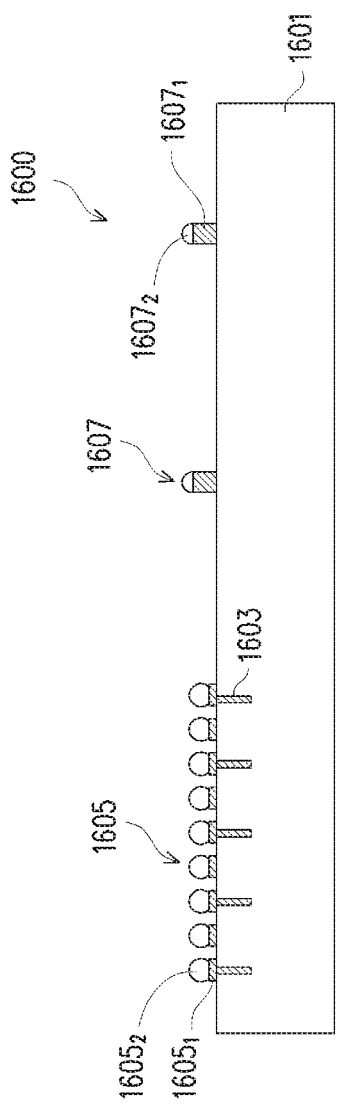

FIGS. 16A, 16B and 17-24 illustrate top and cross-sectional views of various processing steps during fabrication of an integrated circuit package in accordance with some embodiments. FIG. 16A illustrates a top view, while FIGS. 16B and 17-24 illustrate cross-section views along a line BB' in FIG. 16A. Referring first to FIGS. 16A and 16B, a workpiece 1600 is illustrated. In some embodiments, the workpiece 1600 is a wafer, such as an interposer wafer, for example. In other embodiments, the workpiece 1600 is a singulated die, such as an interposer die, for example. In some embodiments, the workpiece 1600 comprises a substrate 1601, which may be formed using similar materials and methods as the substrate 503 of the workpiece 501 described above with reference to FIG. 5, and the description is not repeated herein. The workpiece 1600 comprises interconnects, such as TVs 1603 and lines (not shown) within the substrate 1601. In some embodiments, the interconnects of the workpiece 1600 may be formed using similar material and methods as the interconnects of workpiece 501 described above with reference to FIG. 5, and the description is not repeated herein. The workpiece 1600 further comprises connectors 1605 and plugs 1607. In some embodiments, the plugs 1607 have an annular shape in a plan view as shown in FIG. 16A. In some embodiments, the plugs 1607 and the recesses 1301 of the dummy die 1501 (see FIG. 15) have similar annular shapes, such that the plugs 1607 may be inserted into the recesses 1301 in a subsequent process. Accordingly, the depth D3 (see FIG. 13) of the recesses 1301 may be greater or equal to a height of the plugs 1607, and the width W2 (see FIG. 12B) of the recesses 1301 may be greater or equal to a width of the plugs 1607.

In some embodiments, the connectors 1605 and the plugs 1607 may be formed simultaneously in a same process. In other embodiments, the connectors 1605 and the plugs 1607 may be formed separately at different times in different processes. In some embodiments, the connectors 1605 comprise metal pillar bumps $1605_1$ and solder elements $1605_2$ over the metal pillar bumps $1605_1$. In some embodiments, the plugs 1607 comprise metal bases $1607_1$ and solder elements $1607_2$ over the metal bases $1607_1$. In some embodiments, the metal pillar bumps $1605_1$ and the metal bases $1607_1$ may be formed using similar material and methods as the metal pillar bumps $511_1$ and $511_2$ described above with reference to FIG. 5, and the description is not repeated herein. In some embodiments, the solder elements $1605_2$ and $1607_2$ may be formed using similar material and methods as the solder elements $511_3$ described above with reference to FIG. 5, and the description is not repeated herein. In some embodiments, the metal pillar bumps $1605_1$ and the metal bases $1607_1$ may comprise a same material. In other embodiments, the metal pillar bumps $1605_1$ and the metal bases $1607_1$ may comprise different materials. In some embodiments, the solder elements $1605_2$ and $1607_2$ may comprise a same material. In other embodiments, the solder elements $1605_2$ and $1607_2$ may comprise different materials. In some embodiments, the plugs 1607 may not be electrically connected to other conductive elements within or on the workpiece 1600. In other embodiments, the 1607 plug may comprise an insulating material, such as polybenzoxazole (PBO), polyimide (PI), benzocyclobutene (BCB), a combination thereof, or the like, and may be formed using suitable patterning processes.

Figure 17:
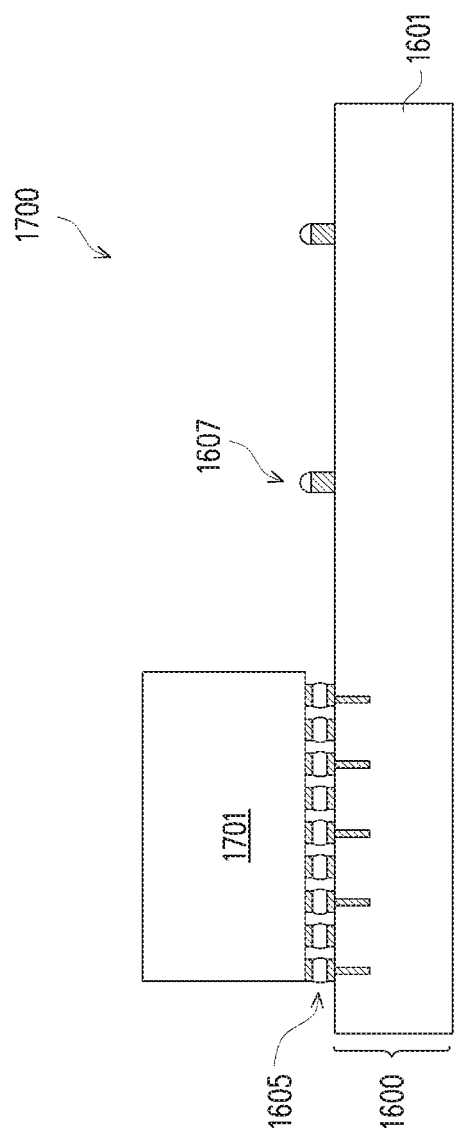

Referring to FIG. 17, an IC die 1701 is mechanically and electrically attached to the workpiece 1600 using the connectors 1605 to start forming a stacked structure 1700. In some embodiments, the IC die 1701 may be formed using similar material and methods as the IC dies 507 and 509 described above with reference to FIG. 5, and the description is not repeated herein.

Figure 18:
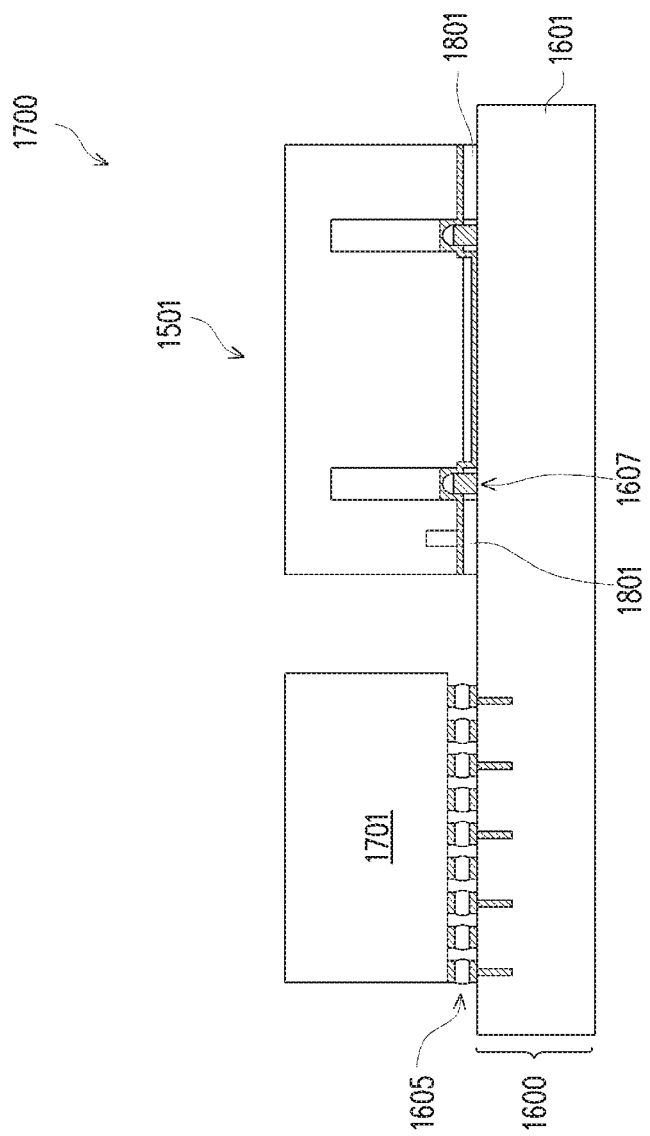

Referring to FIG. 18, the dummy die 1501 is attached to the workpiece 1600 using an adhesive 1801. In some embodiments, the plug 1607 extends into the recess 1301 (see FIG. 15) of the dummy die 1501 and secures the dummy die 1501 in a desired location on the workpiece 1600. In other embodiments, the dummy die 1501 may be attached to the workpiece 1600 using a direct bonding method, or other suitable bonding methods.

Figure 19:
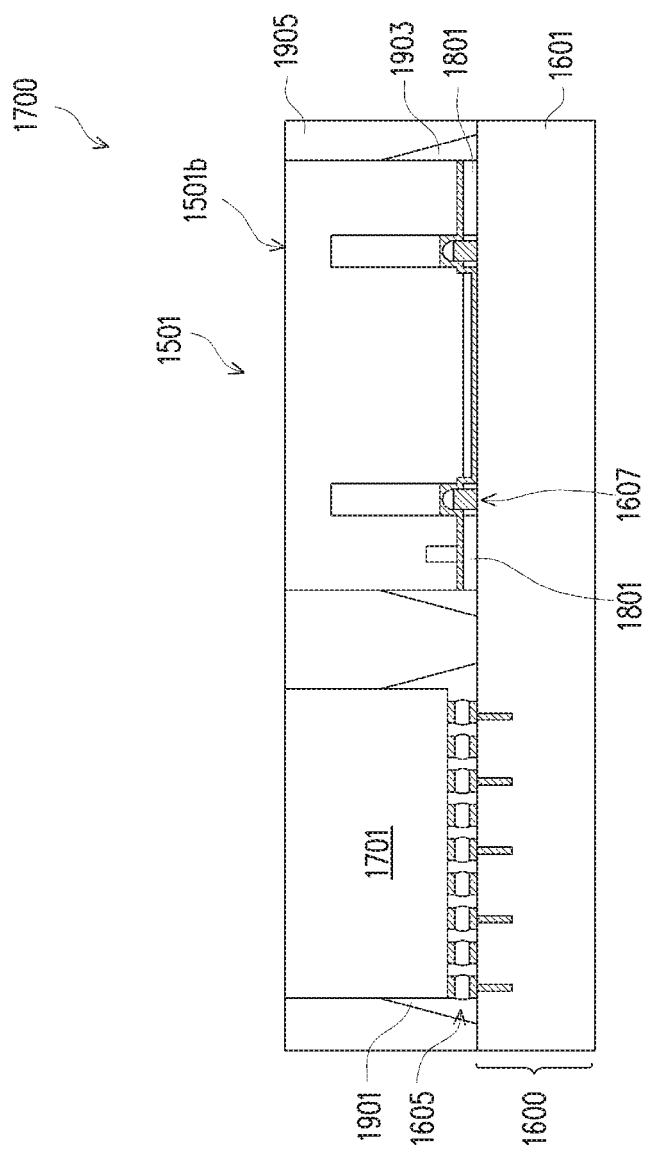

Referring to FIG. 19, an underfill layer 1901 is formed around the connectors 1605 and the IC die 1701. An underfill layer 1903 is also formed around the plugs 1607 and the dummy die 1501. In some embodiments, the underfill layers 1901 and 1903 may be formed using similar materials and methods as the underfill layer 513 described above with reference to FIG. 5, and the description is not repeated herein. In some embodiments, the underfill layers 1901 and 1903 may comprise a same material. In other embodiments, the underfill layers 1901 and 1903 may comprise different materials. In other embodiments, the underfill layer 1903 may be omitted.

In some embodiments, an encapsulant 1905 is formed over the workpiece 1600, and around the IC die 1701 and the dummy die 1501. In some embodiments, the encapsulant 1905 may be formed using similar material and methods as the encapsulant 701 described above with reference to FIG. 7, and the description is not repeated herein. In some embodiment, a planarization process may be performed on the encapsulant 1905 to remove excess portions of the encapsulant 1905, such that a topmost surface of the encapsulant 1905 is substantially level with a backside surface 1501b of the dummy die 1501 and a topmost surface of the IC die 1701 after the planarization process. In some embodiments, the planarization process may comprise a CMP process, an etching process, grinding, a combination thereof, or the like. In some embodiments wherein a height of the IC die 1701 is greater than a height of the dummy die 1501, the planarization process may also remove a portion of the IC die 1701.

Figure 20:
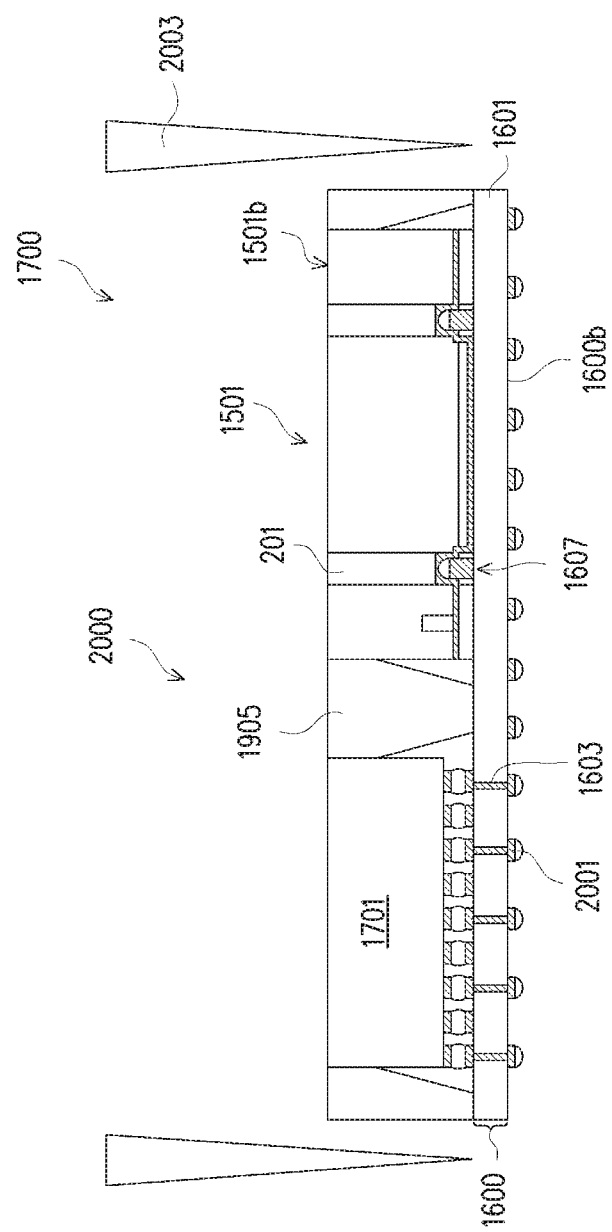

Referring to FIG. 20, a backside 1600b of the workpiece 1600 is thinned to expose the TVs 1603, and connectors 2001 are formed on the backside 1600b of the workpiece 1600 in electrical contact with respective TVs 1603. In some embodiments, the backside 1600b of the workpiece 1600 may be thinned using a CMP process, an etching process, grinding, a combination thereof, or the like. In some embodiments, the connectors 2001 may be similar to the connectors 801, may be formed using similar materials and methods as described above with reference to FIG. 8, and the description is not repeated herein.

Referring further to FIG. 20, after forming the connectors 2001, a further planarization process is performed on the IC die 1701, the dummy die 1501 and the encapsulant 1905 to expose the insulating material 201 disposed in the openings 109 (see FIGS. 12A and 12B) of the dummy die 1501. In some embodiments, the backside surface 1501b of the dummy die 1501 is substantially level with the topmost surface of the encapsulant 1905 and the topmost surface of the IC die 1701 after the planarization process. In some embodiments, the planarization process may comprise a CMP process, an etching process, grinding, a combination thereof, or the like. In some embodiments, the insulating material 201 disposed in the openings 109 (see FIGS. 12A and 12B) of the dummy die 1501 protects the workpiece 1600 from contamination during the planarization process. In some embodiments where the workpiece 1600 is a wafer, a singulation process 2003 may be performed to separate the stacked structure 1700 into individual stacked structures 2000. The singulation process 2003 may comprise sawing, etching, laser ablation, a combination thereof, or the like.

Figure 21:
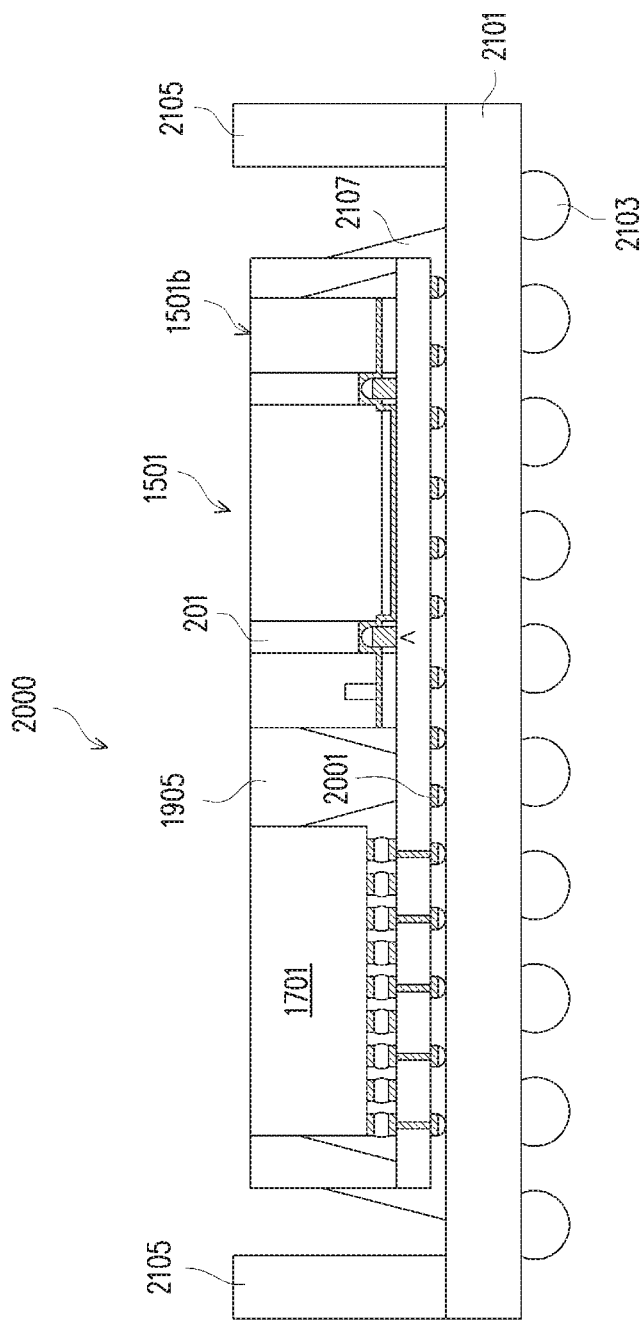

Referring to FIG. 21, the stacked structure 2000 is mechanically and electrically attached to a workpiece 2101 using the connectors 2001. In some embodiments where the connectors 2001 are formed of a solder material, a reflow process may be performed to bond the stacked structure 2000 to the workpiece 2101. In some embodiments, the workpiece 2101 may comprise a package substrate, a printed circuit board (PCB), a ceramic substrate, or the like. In some embodiments, the workpiece 2101 may comprise interconnects (such a conductive lines and vias) in and/or on the workpiece 2101. In some embodiment, connectors 2103 are formed on the workpiece 2101 on a side opposite from the stacked structure 2000. In some embodiments, the connectors 2103 may be similar to the connectors 903, may be formed using similar materials and methods as described above with reference to FIG. 9, and the description is not repeated herein. In some embodiments, an underfill layer 2107 is formed around the connectors 2001. In some embodiment, the underfill layer 2107 may be formed using similar materials and methods as the underfill layer 513 described above with reference to FIG. 5, and the description is not repeated herein. In some embodiments, an annular structure 2105 may be attached to the workpiece 2101 on a same side as the stacked structure 2000, such that the stacked structure 2000 is disposed within an opening of the annular structure 2105. In some embodiments, annular structure 2105 may prevent warpage of the workpiece 2101 and the attached stacked structure 2000. In some embodiments, the annular structure 2105 may comprise an insulating material, stainless steel, brass, copper, a combination thereof, or the like. In other embodiments, the annular structure 2105 may be omitted.

Figure 22:
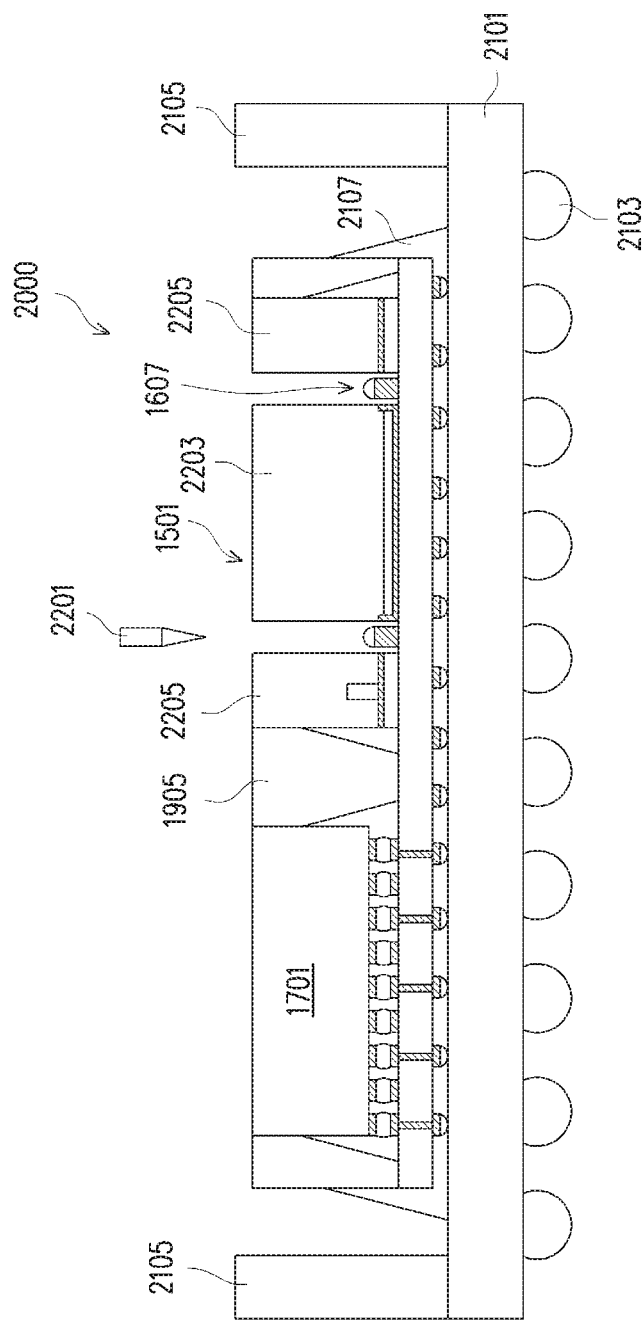

Referring to FIG. 22, after attaching the stacked structure 2000 to the workpiece 2101, the insulating material 201 (see FIG. 21) is removed from the openings 109 (see FIGS. 12A and 12B) of the dummy die 1501. In some embodiments, the insulating material 201 is removed using a laser drilling process 2201. In other embodiments, the insulating material 201 may be removed using other suitable removal processes, such as an etching process, for example. After removing the insulating material 201, the dummy die 1501 is separated into an interior region 2203 and an annular region 2205. In some embodiments, the plug 1607 may act as a stop layer during the removal of the insulating material 201.

Figure 23:
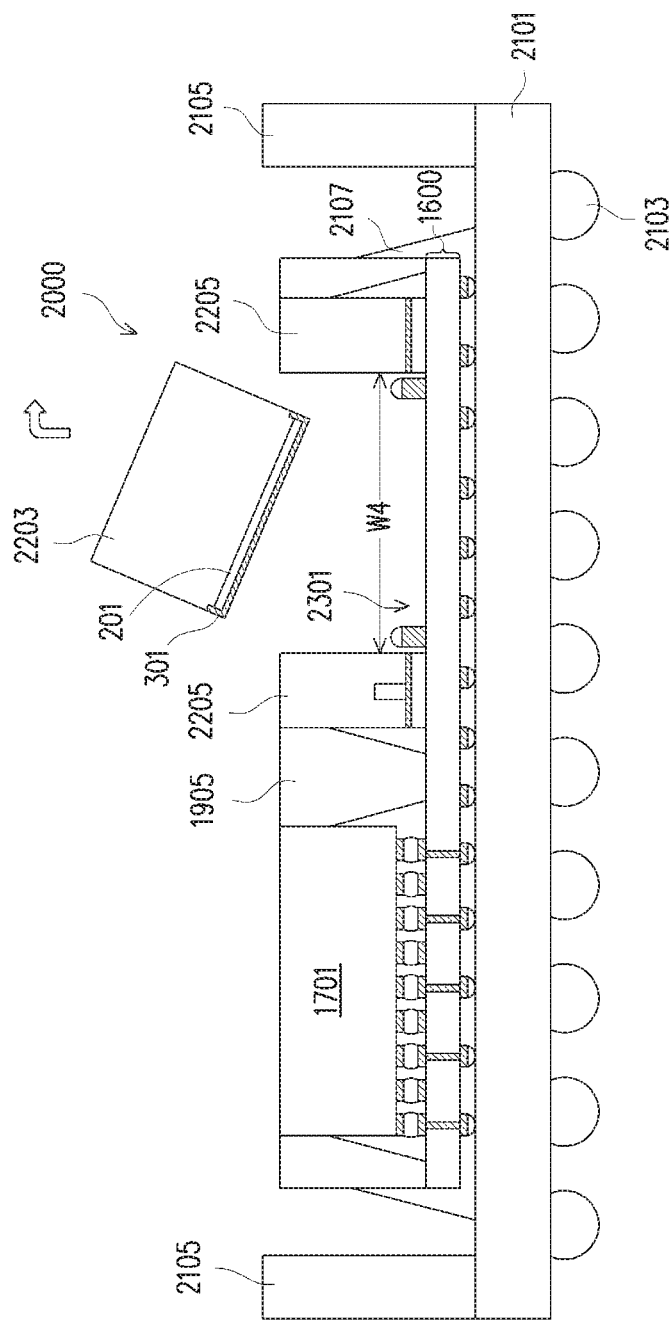

Referring to FIG. 23, the interior region 2203 of the dummy die 1501 (see FIG. 22) is removed to expose an opening 2301 in the annular region 2205 of the dummy die 1501. In some embodiments, the interior region 2203 of the dummy die 1501 is removed using a pick-and-place apparatus. In other embodiments, the interior region 2203 of the dummy die 1501 may be removed manually or using other suitable removal methods. In some embodiments, the conductive layer 301 may aid the removal process of the interior region 2203 by acting as a buffer between the insulating material 201 and the workpiece 1600 and by preventing bonding between the insulating material 201 and the workpiece 1600. In some embodiments, the opening 2301 exposes a top surface of the workpiece 1600. In some embodiments, the openings 2301 have a width W4 between about 1 mm and about 30 mm. In other embodiments, the width W4 may be greater than about 30 mm.

Figure 24:
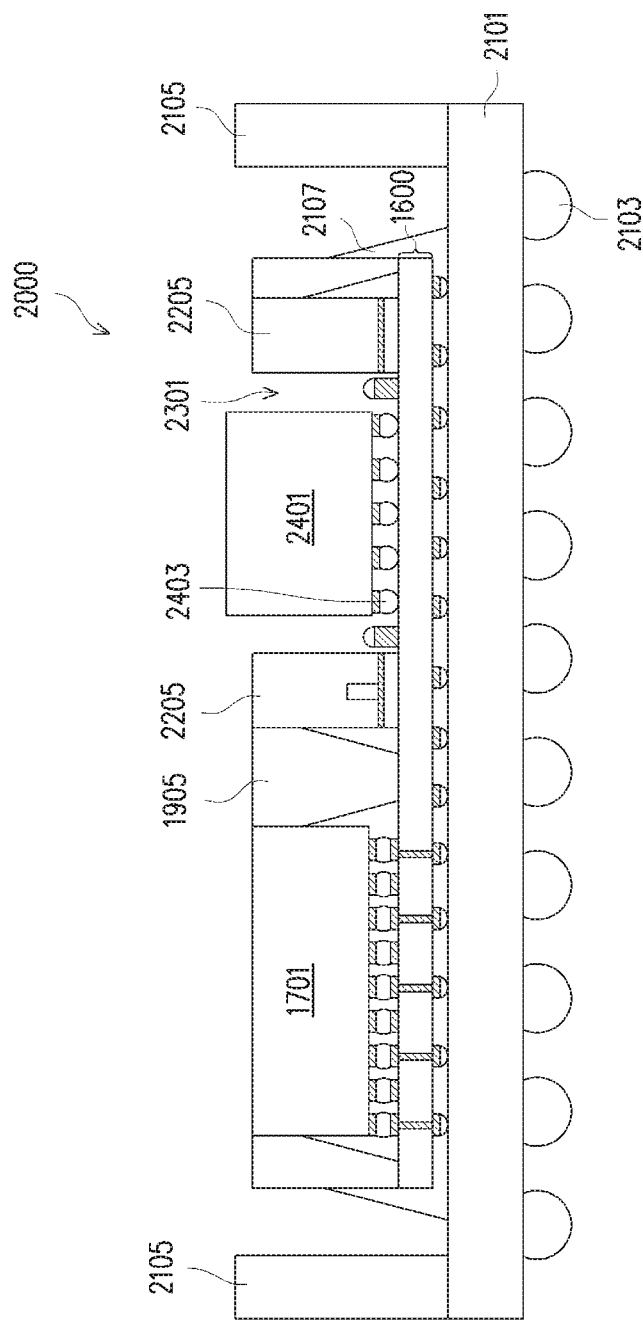

Referring to FIG. 24, a functional component 2401 is placed in the opening 2301. In some embodiments, the functional component 2401 may be an IC die similar to the IC die 1701. In such embodiments, the functional component 2401 may be mechanically and electrically connected to the workpiece 1600 using connectors 2403. In some embodiments, the connectors 2403 may be formed using similar materials and methods as the connectors 511 described above with reference to FIG. 5, and the description is not repeated herein. In other embodiments, the functional component 2401 may be mechanically and electrically connected to the workpiece 1600 using a direct bonding method, such as a hybrid bonding method, or the like. In some embodiments wherein the resulting package is used in photonics applications, the functional component 2401 may comprise a photonic fiber module, LaMP, a coupler, or the like. In such embodiments, the functional component 2401 may be attached to the workpiece 1600 only mechanically.

Figure 25:
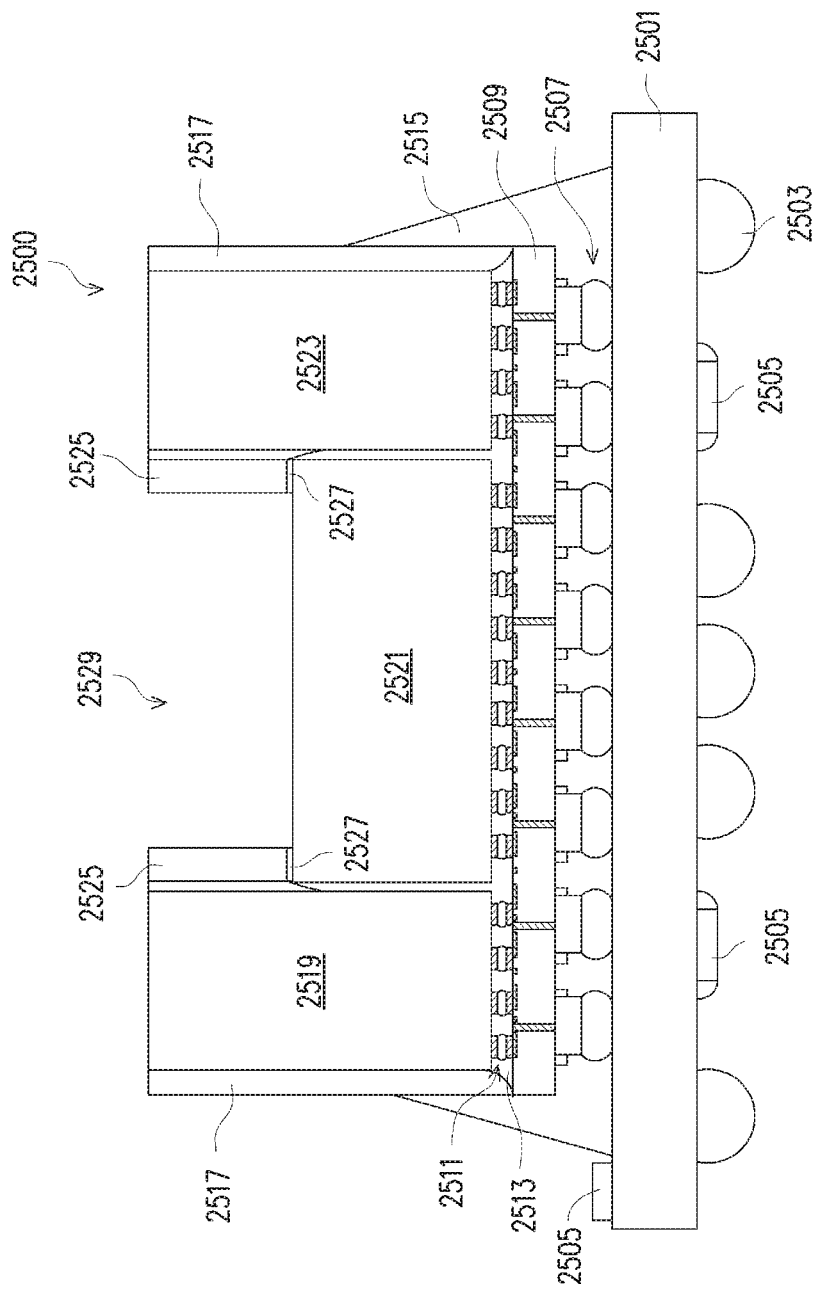
FIG. 25 illustrates a cross-sectional view of an integrated circuit package in accordance with some embodiments.

FIG. 25 illustrates a cross-sectional view of an integrated circuit package 2500 in accordance with some embodiments. In some embodiments, the IC package 2500 may be formed using a method similar to the method described above with reference to FIGS. 1A, 1B and 2-11, and the description is not repeated herein. The IC package 2500 comprises a workpiece 2501. In some embodiments, the workpiece 2501 may be similar to the workpiece 901 described above with reference to FIG. 9, and the description is not repeated herein. Connectors 2503 are formed on a bottom surface of the workpiece 2501. In some embodiments, the connectors 2503 may be similar to the connectors 903 described above with reference to FIG. 9, and the description is not repeated herein. Surface mount devices (SMDs) 2505 are attached to a top surface and/or to the bottom surface of the workpiece. A workpiece 2509 is attached to the workpiece 2501 using connectors 2507. In some embodiments, workpiece 2509 may be similar to the workpiece 501 described above with reference to FIG. 5, and the description is not repeated herein. In some embodiments, the connectors 2507 may be similar to the connectors 801 described above with reference to FIG. 8, and the description is not repeated herein. An underfill layer 2515 is formed around the connectors 2507. In some embodiments, the underfill layer 2515 is similar to the underfill layer 905 described above with reference to FIG. 9, and the description is not repeated herein. IC dies 2519, 2521 and 2523 are attached to the workpiece 2509 using connectors 2511, and an underfill layer 2513 is formed around the connectors 2511. In some embodiments, the IC dies 2519, 2521 and 2523 are similar to the IC dies 507 and 509 described above with reference to FIG. 5, and the description is not repeated herein. In some embodiments, the connectors 2511 are similar to the connectors 511 described above with reference to FIG. 5, and the description is not repeated herein. In some embodiment, the underfill layer 2513 may be similar to the underfill layer 513 described above with reference to FIG. 5, and the description is not repeated herein. Topmost surfaces of the IC dies 2519 and 2523 are above a topmost surface of the IC die 2521. An annular structure 2525 is attached to the IC die 2521 using an adhesive 2527. In some embodiments, the annular structure 2525 may be formed using a method similar to the method described above with reference to FIGS. 1A, 1B and 2-11, and the description is not repeated herein. An encapsulant 2517 is formed around the IC dies 2519, 2521 and 2523, and the annular structure 2525, such that an opening 2529 of the annular structure 2525 is free from the encapsulant 2517. In some embodiments, the encapsulant 2517 is similar to the encapsulant 701 described above with reference to FIG. 7, and the description is not repeated herein. The topmost surfaces of the IC dies 2519 and 2523, and a topmost surface of the annular structure 2525 are substantially level or coplanar with a topmost surface of the encapsulant 2517.

Figure 26:
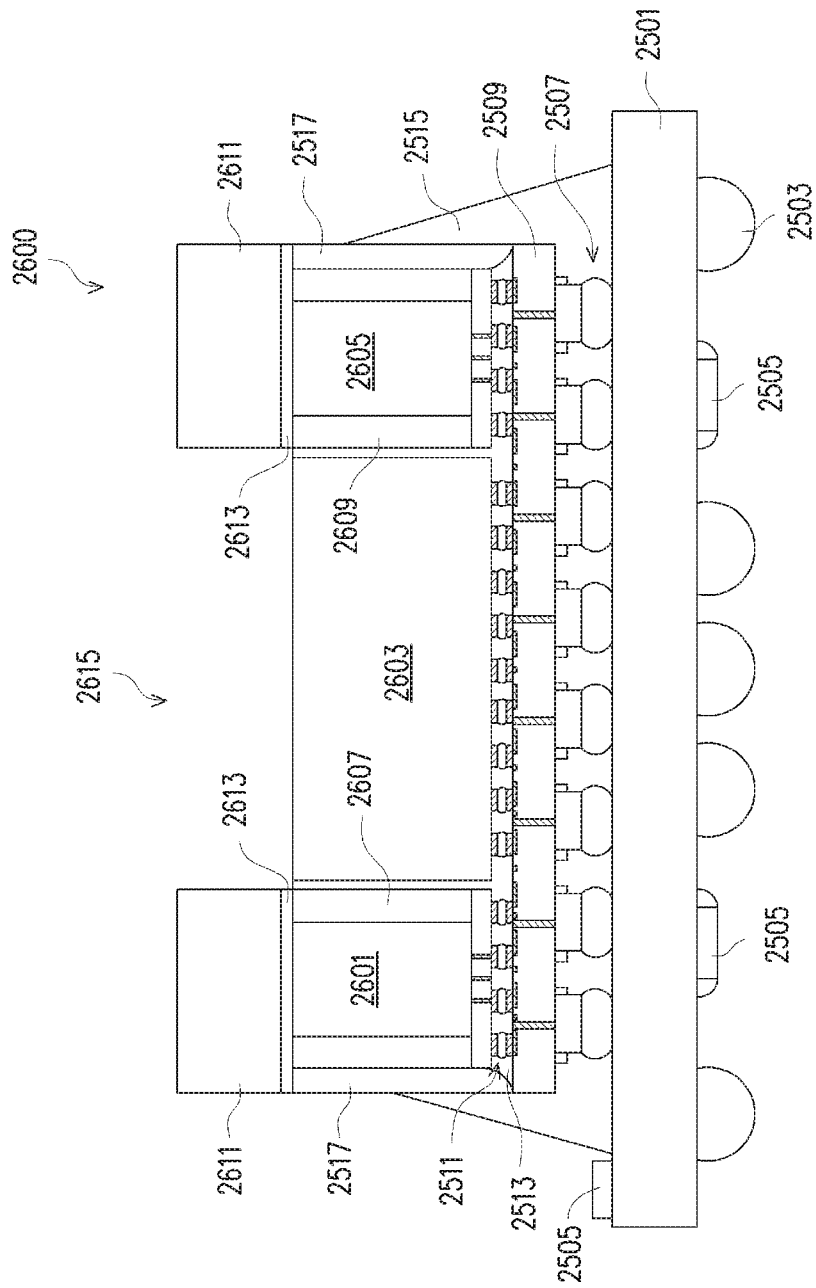
FIG. 26 illustrates a cross-sectional view of an integrated circuit package in accordance with some embodiments.

FIG. 26 illustrates a cross-sectional view of an integrated circuit package 2600 in accordance with some embodiments. In some embodiments, the IC package 2600 may be formed using a method similar to the method described above with reference to FIGS. 1A, 1B and 2-11, and the description is not repeated herein. To highlight differences between the IC package 2600 and the IC package 2500 (see FIG. 25), the common features of these packages are labeled by same numerical references and their description is not repeated herein. The IC package 2600 is similar to the IC package 2500 (see FIG. 25), with the distinction that the IC package 2600 comprises IC dies 2601, 2603 and 2605, such that a topmost surface of the IC die 2601 is substantially level or coplanar with a topmost surface of the IC die 2603, a topmost surface of the IC die 2605, and a topmost surface of the encapsulant 2517. Furthermore, the IC dies 2601 and 2605 comprise respective die stacks encapsulated in encapsulants 2607 and 2609, respectively. In some embodiments, the die stacks of IC dies 2601 and 2605 comprise a plurality of dies bonded to each other. In some embodiments, the plurality of dies may be bonded to each other using a direct bonding method, such as a hybrid bonding method, or the like. In other embodiment, the plurality of dies may be bonded to each other using connectors. In the illustrated embodiment, annular structure 2611 is attached to the IC dies 2601 and 2605 using an adhesive 2613, such that an opening 2615 of the annular structure 2611 exposes a topmost surface of the IC die 2603. In some embodiments, the annular structure 2611 may be formed using a method similar to the method described above with reference to FIGS. 1A, 1B and 2-11, and the description is not repeated herein.

Figure 27:
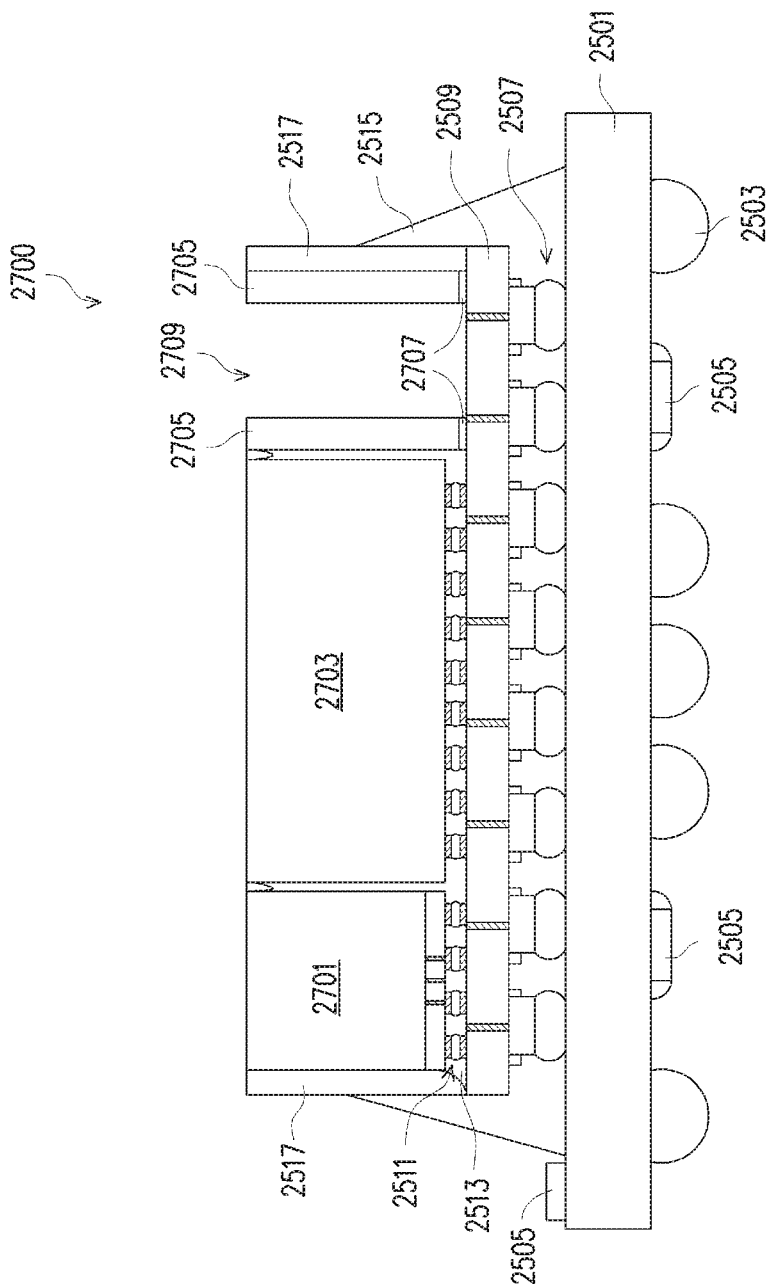
FIG. 27 illustrates a cross-sectional view of an integrated circuit package in accordance with some embodiments.

FIG. 27 illustrates a cross-sectional view of an integrated circuit package 2700 in accordance with some embodiments. In some embodiments, the IC package 2700 may be formed using a method similar to the method described above with reference to FIGS. 12A, 12B, 13-15, 16A, 16B and 17-24, and the description is not repeated herein. To highlight differences between the IC package 2700 and the IC package 2500 (see FIG. 25), the common features of these packages are labeled by same numerical references and their description is not repeated herein. The IC package 2700 is similar to the IC package 2500 (see FIG. 25), with the distinction that the IC package 2700 comprises IC dies 2701 and 2703, and an annular structure 2705, such that a topmost surface of the IC die 2701 is substantially level or coplanar with a topmost surface of the IC die 2703, a topmost surface of the annular structure 2705, and a topmost surface of the encapsulant 2517. In the illustrated embodiment, the annular structure 2705 is attached to the workpiece 2509 using an adhesive 2707, such that an opening 2709 of the annular structure 2705 exposes a top surface of the workpiece 2509. In some embodiments, the annular structure 2705 may be formed using a method similar to the method described above with reference to FIGS. 12A, 12B, 13-15, 16A, 16B and 17-24, and the description is not repeated herein.

Figure 28:
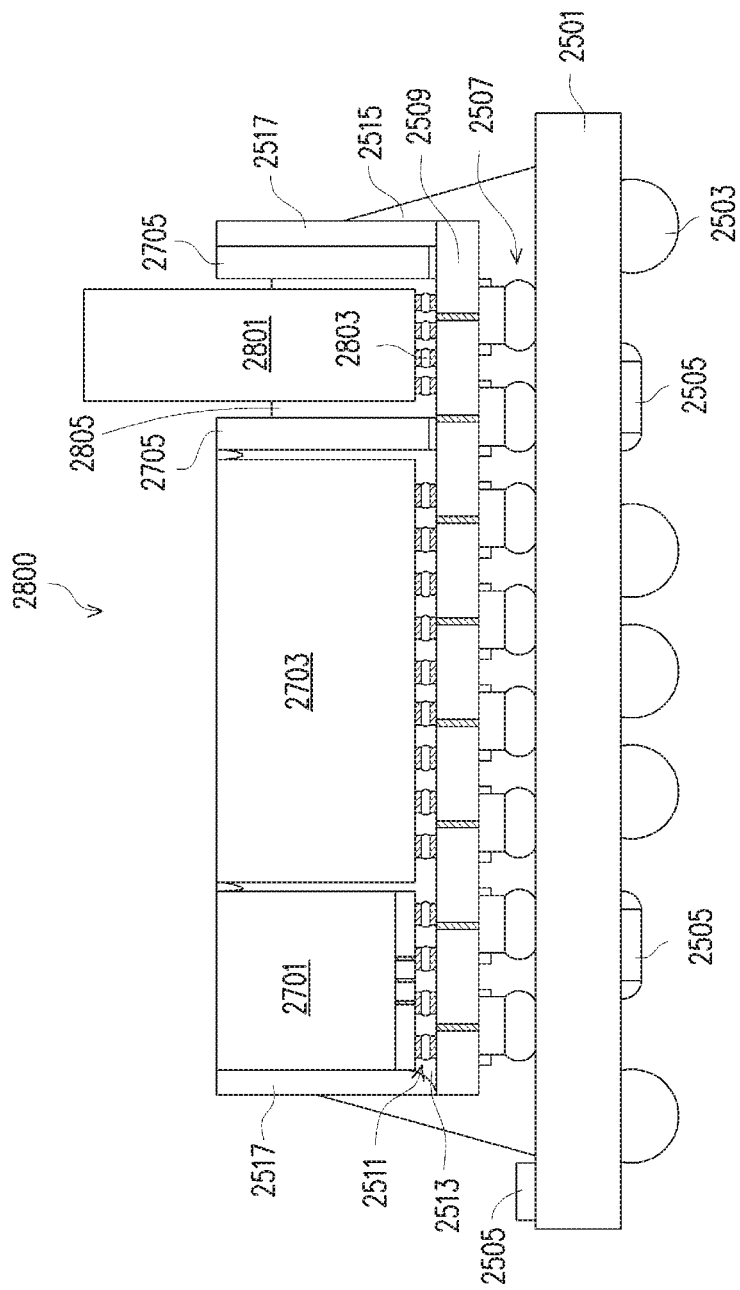
FIG. 28 illustrates a cross-sectional view of an integrated circuit package in accordance with some embodiments.

FIG. 28 illustrates a cross-sectional view of an integrated circuit package 2800 in accordance with some embodiments. In some embodiments, the IC package 2800 may be formed by placing a functional component 2801 in an opening 2709 of the annular structure 2705 of the IC package 2700 (see FIG. 27) and bonding the functional component 2801 to the workpiece 2509 using connectors 2803. Subsequently, an underfill layer 2805 is formed around the connectors 2803. In some embodiment, the underfill layer 2805 may be similar to the underfill layer 513 described above with reference to FIG. 5, and the description is not repeated herein. In some embodiments, the functional component 2801 may be similar to the functional component 2401 described above with reference to FIG. 24, and the description is not repeated herein. In the illustrated embodiment, a topmost surface of the functional component 2801 is above the topmost surface of the annular structure 2705. In other embodiments, the topmost surface of the functional component 2801 may be below the topmost surface of the annular structure 2705.

Figure 29:
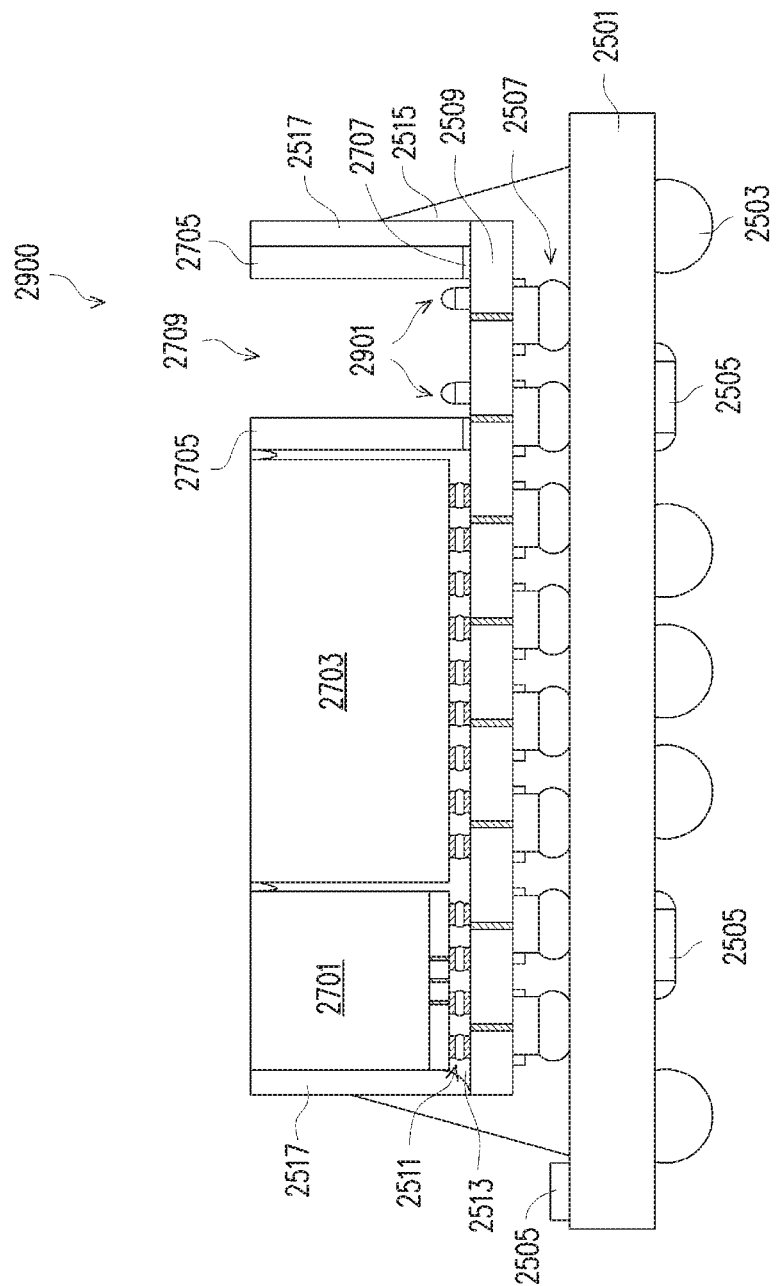
FIG. 29 illustrates a cross-sectional view of an integrated circuit package in accordance with some embodiments.

FIG. 29 illustrates a cross-sectional view of an integrated circuit package 2900 in accordance with some embodiments. In some embodiments, the IC package 2900 may be formed using a method similar to the method described above with reference to FIGS. 12A, 12B, 13-15, 16A, 16B and 17-24, and the description is not repeated herein. To highlight differences between the IC package 2900 and the IC package 2700 (see FIG. 27), the common features of these packages are labeled by same numerical references and their description is not repeated herein. The IC package 2900 is similar to the IC package 2700 (see FIG. 27), with the distinction that plugs 2901 remain in the opening 2709. In some embodiments, the plugs 2901 may be formed using similar materials and methods as the plugs 1607 described above with reference to FIGS. 16A and 16B, and the description is not repeated herein.

Figure 30:
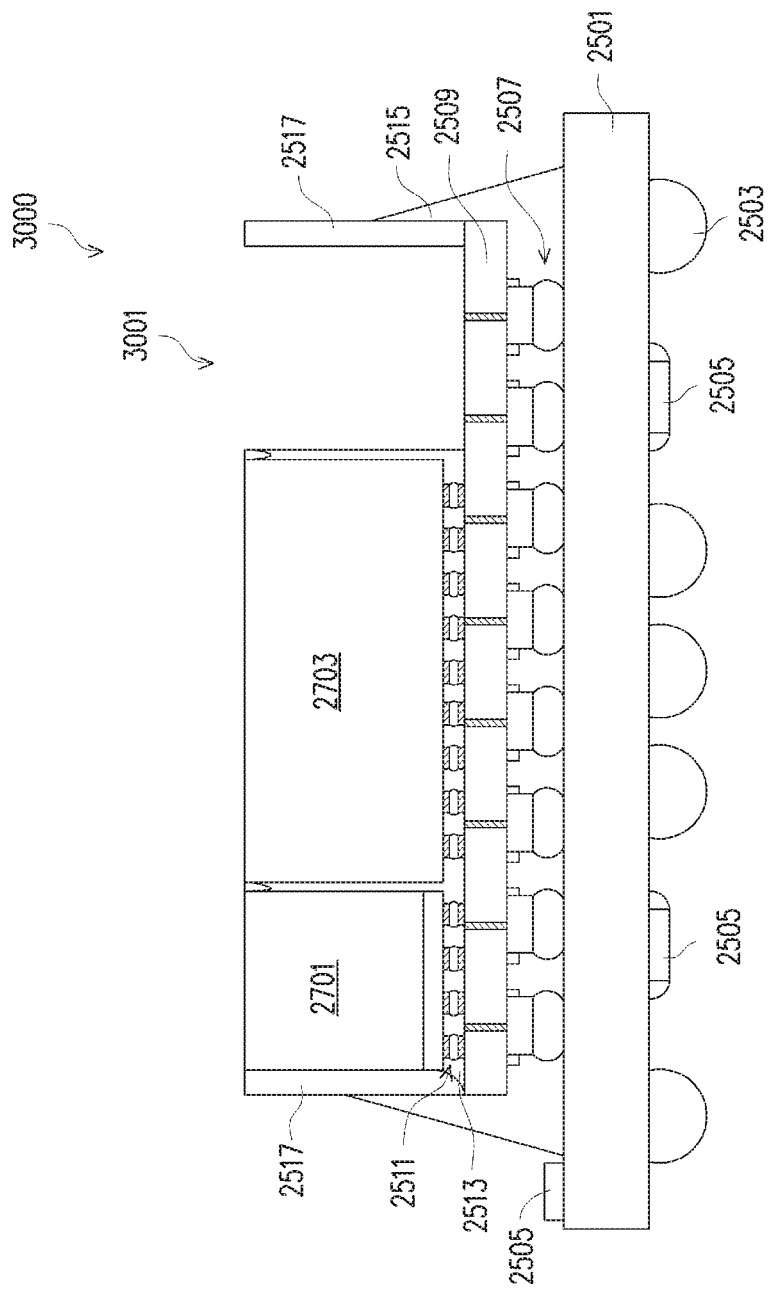
FIG. 30 illustrates a cross-sectional view of an integrated circuit package in accordance with some embodiments.

FIG. 30 illustrates a cross-sectional view of an integrated circuit package 3000 in accordance with some embodiments. In some embodiments, the IC package 3000 may be formed using a method similar to the method described above with reference to FIGS. 12A, 12B, 13-15, 16A, 16B and 17-24, and the description is not repeated herein. To highlight differences between the IC package 3000 and the IC package 2700 (see FIG. 27), the common features of these packages are labeled by same numerical references and their description is not repeated herein. The IC package 3000 is similar to the IC package 2700 (see FIG. 27), with the distinction that a dummy die (such as, for example, the dummy dies 401 and 1501 illustrated in FIGS. 4 and 15, respectively) is completely removed. In some embodiments, the dummy die may be removed using any suitable removal process to form an opening 3001. The opening 3001 exposes a top surface of the workpiece 2509.

Figure 31:
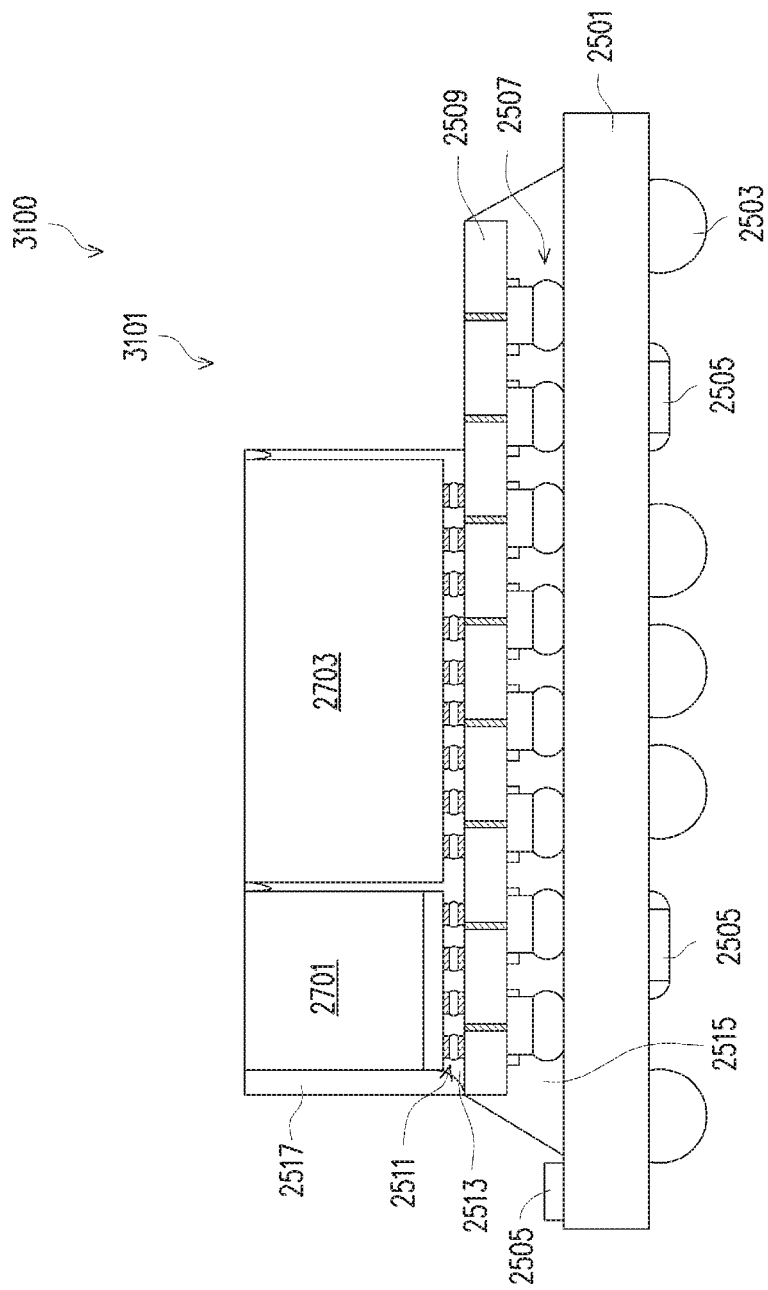
FIG. 31 illustrates a cross-sectional view of an integrated circuit package in accordance with some embodiments.

FIG. 31 illustrates a cross-sectional view of an integrated circuit package 3100 in accordance with some embodiments. In some embodiments, the IC package 3100 may be formed using a method similar to the method described above with reference to FIGS. 12A, 12B, 13-15, 16A, 16B and 17-24, and the description is not repeated herein. To highlight differences between the IC package 3100 and the IC package 3000 (see FIG. 30), the common features of these packages are labeled by same numerical references and their description is not repeated herein. The IC package 3100 is similar to the IC package 3000 (see FIG. 30), with the distinction that, in addition to completely removing a dummy die (such as, for example, the dummy dies 401 and 1501 illustrated in FIGS. 4 and 15, respectively), portions of the underfill layer 2513 and the encapsulant 2517 surrounding the dummy die are also removed. In some embodiments, the dummy die and the portions of the underfill layer 2513 and the encapsulant 2517 may be removed using any suitable removal process to form an opening 3101. The opening 3101 exposes a top surface of the workpiece 2509.

Figure 32:
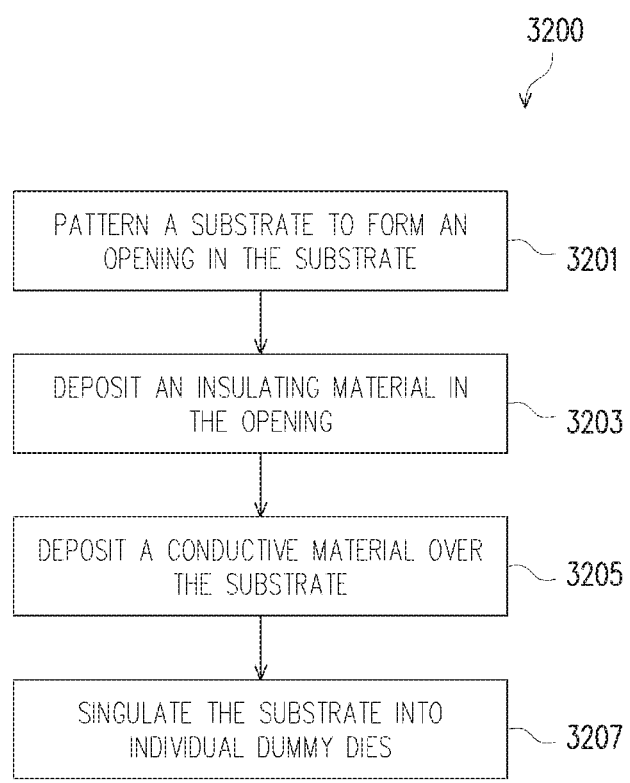
FIG. 32 is a flow diagram illustrating a method of forming of dummy dies in accordance with some embodiments.

FIG. 32 is a flow diagram illustrating a method 3200 of forming of dummy dies in accordance with some embodiments. The method 3200 starts with step 3201, where a substrate (such as, for example, the substrate 105 illustrated in FIGS. 1A and 1B) is patterned to form an opening (such as, for example, the opening 109 illustrated in FIGS. 1A and 1B) in the substrate as described above with reference to FIGS. 1A and 1B. In step 3203, an insulating material (such as, for example, the insulating material 201 illustrated in FIG. 2) is deposited in the opening as described above with reference to FIG. 2. In step 3205, a conductive material (such as, for example, the conductive layer 301 illustrated in FIG. 3) is deposited over the substrate as described above with reference to FIG. 3. In step 3207, the substrate is singulated into individual dummy dies (such as, for example, the dummy dies 401 illustrated in FIG. 4) as described above with reference to FIG. 4.

Figure 33:
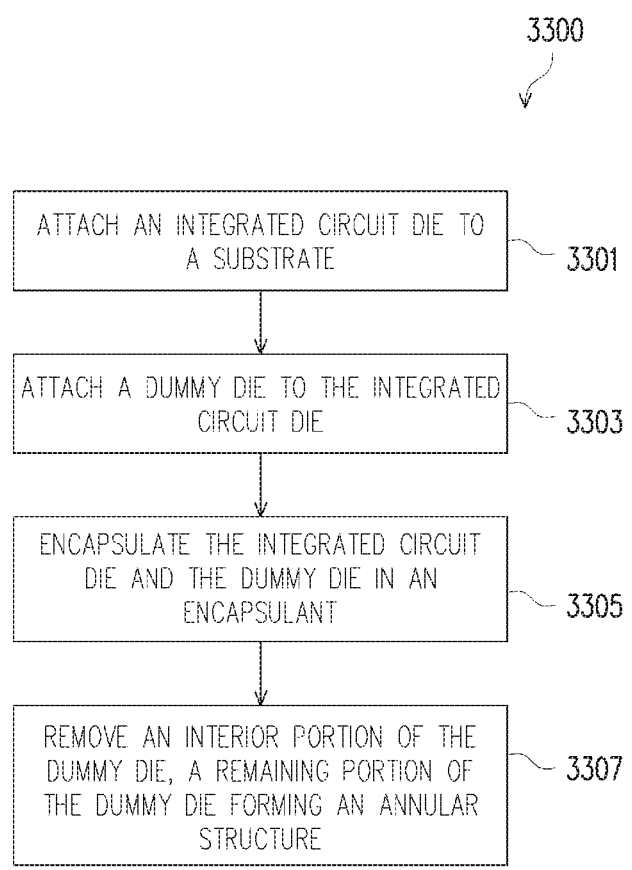
FIG. 33 is a flow diagram illustrating a method of forming of an integrated circuit package in accordance with some embodiments.

FIG. 33 is a flow diagram illustrating a method 3300 of forming of an integrated circuit package in accordance with some embodiments. The method 3300 starts with step 3301, where an integrated circuit die (such as, for example, the IC die 507 illustrated in FIG. 5) is attached to a substrate (such as, for example, the workpiece 501 illustrated in FIG. 5) as described above with reference to FIG. 5. In step 3303, a dummy die (such as, for example, the dummy die 401 illustrated in FIG. 6) is attached to the integrated circuit die as described above with reference to FIG. 6. In step 3305, the integrated circuit die and the dummy die are encapsulated in an encapsulant (such as, for example, the encapsulant 701 illustrated in FIG. 6) as described above with reference to FIG. 7. In step 3307, an interior region (such as, for example, the interior region 909 illustrated in FIG. 10) of the dummy die is removed, such that a remaining portion of the dummy die forms an annular structure (such as, for example, the annular region 911 illustrated in FIG. 10) as described above with reference to FIGS. 8-10.

Figure 34:
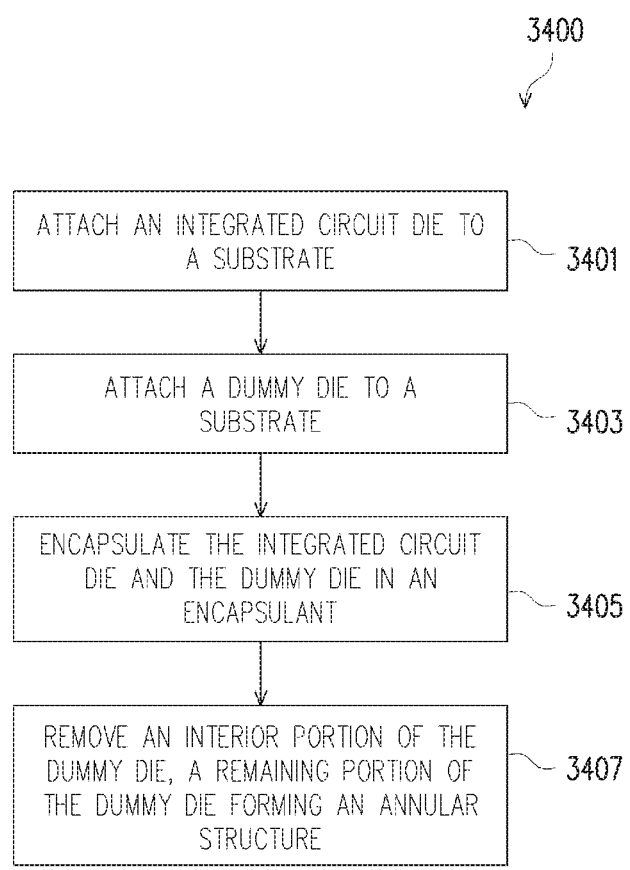
FIG. 34 is a flow diagram illustrating a method of forming of an integrated circuit package in accordance with some embodiments.

FIG. 34 is a flow diagram illustrating a method 3400 of forming of an integrated circuit package in accordance with some embodiments. The method 3400 starts with step 3401, where an integrated circuit die (such as, for example, the IC die 1701 illustrated in FIG. 17) is attached to a substrate (such as, for example, the workpiece 1600 illustrated in FIG. 17) as described above with reference to FIG. 17. In step 3403, a dummy die (such as, for example, the dummy die 1501 illustrated in FIG. 18) is attached to the substrate as described above with reference to FIG. 18. In step 3405, the integrated circuit die and the dummy die are encapsulated in an encapsulant (such as, for example, the encapsulant 1905 illustrated in FIG. 19) as described above with reference to FIG. 19. In step 3407, an interior region (such as, for example, the interior region 2203 illustrated in FIG. 23) of the dummy die is removed, such that a remaining portion of the dummy die forms an annular structure (such as, for example, the annular region 2205 illustrated in FIG. 23) as described above with reference to FIGS. 20-23.

In accordance with an embodiment, a method includes: attaching an integrated circuit die to a first substrate; forming a dummy die; attaching the dummy die to the first substrate adjacent the integrated circuit die; forming an encapsulant over the first substrate and surrounding the dummy die and the integrated circuit die; planarizing the encapsulant, the dummy die and the integrated circuit die, a topmost surface of the encapsulant being substantially level with a topmost surface of the dummy die and a topmost surface of the integrated circuit die; and removing an interior portion of the dummy die, a remaining portion of the dummy die forming an annular structure. In an embodiment, forming the dummy die includes: patterning a second substrate to form an opening in the second substrate, the opening having an annular shape in a plan view; and depositing an insulating material in the opening. In an embodiment, planarizing the encapsulant, the dummy die and the integrated circuit die includes exposing the insulating material. In an embodiment, removing the interior portion of the dummy die includes: removing the insulating material, where the dummy die is separated into an interior region and a peripheral region after removing the insulating material; and picking up the interior region from the first substrate, the peripheral region forming an annular structure. In an embodiment, removing the insulating material includes removing the insulating material using a laser drilling method. In an embodiment, the dummy die is attached to the first substrate using an adhesive. In an embodiment, the method further includes: placing a functional component within the annular structure; and bonding the functional component to the first substrate, where the functional component and the annular structure have different heights.

In accordance with another embodiment, a method includes: attaching an integrated circuit die to a first side of a first substrate; forming a dummy die, the dummy die comprising a first annular structure within the dummy die; attaching the dummy die to the first side of the first substrate adjacent the integrated circuit die; forming a molding compound over the first substrate and surrounding the dummy die and the integrated circuit die, a top surface of the molding compound being substantially level with a topmost surface of the dummy die, a topmost surface of the first annular structure, and a topmost surface of the integrated circuit die; removing the first annular structure, the dummy die being separated into an interior region and a peripheral annular region after removing the first annular structure; detaching the interior region of the dummy die from the first substrate, the peripheral annular region of the dummy die forming a second annular structure; placing a functional component on the first side of the first substrate within the second annular structure; and attaching the functional component to the first side of the first substrate. In an embodiment, forming the dummy die includes: patterning a second substrate to form an opening in the second substrate, the opening having an annular shape in a plan view; and depositing an insulating material in the opening to form the first annular structure. In an embodiment, removing the first annular structure includes performing a laser drilling process. In an embodiment, the dummy die is attached to the first side of the first substrate using an adhesive. In an embodiment, the functional component and the second annular structure have different heights. In an embodiment, the method further includes forming a plurality of connectors on a second side of the first substrate, the second side of the first substrate being opposite the first side of the first substrate. In an embodiment, the first substrate comprises an interposer.

In accordance with yet another embodiment, a package includes: a substrate; a first integrated circuit die bonded to a first side of the substrate; an annular structure bonded to the first side of the substrate adjacent the first integrated circuit die; an encapsulant over the substrate and surrounding the annular structure and the first integrated circuit die, a topmost surface of the encapsulant being level with a topmost surface of the annular structure and a topmost surface of the first integrated circuit die; and a functional component within the annular structure and bonded to the first side of the substrate. In an embodiment, the package further includes an adhesive interposed between the first side of the substrate and the annular structure. In an embodiment, the package further includes a plurality of connectors on a second side of the substrate, the second side of the substrate being opposite the first side of the substrate. In an embodiment, the substrate comprises an interposer. In an embodiment, the functional component comprises a second integrated circuit die. In an embodiment, the functional component and the annular structure have different heights.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
    attaching an integrated circuit die to a first substrate;
    forming a dummy die;
    attaching the dummy die to the first substrate adjacent the integrated circuit die;
    forming an encapsulant over the first substrate and surrounding the dummy die and the integrated circuit die;
    planarizing the encapsulant, the dummy die and the integrated circuit die, a topmost surface of the encapsulant being substantially level with a topmost surface of the dummy die and a topmost surface of the integrated circuit die; and
    removing an interior portion of the dummy die, a remaining portion of the dummy die forming an annular structure.

2. The method of claim 1, wherein forming the dummy die comprises:
    patterning a second substrate to form an opening in the second substrate, the opening having an annular shape in a plan view; and
    depositing an insulating material in the opening.

3. The method of claim 2, wherein planarizing the encapsulant, the dummy die and the integrated circuit die comprises exposing the insulating material.

4. The method of claim 2, wherein removing the interior portion of the dummy die comprises:
    removing the insulating material, wherein the dummy die is separated into an interior region and a peripheral region after removing the insulating material; and
    picking up the interior region from the first substrate, the peripheral region forming the annular structure.

5. The method of claim 4, wherein removing the insulating material comprises removing the insulating material using a laser drilling method.

6. The method of claim 1, wherein the dummy die is attached to the first substrate using an adhesive.

7. The method of claim 1, further comprises:
    placing a functional component within the annular structure; and
    bonding the functional component to the first substrate, wherein the functional component and the annular structure have different heights.

8. A method comprising:
    attaching an integrated circuit die to a first side of a first substrate;
    forming a dummy die, the dummy die comprising a first annular structure within the dummy die;
    attaching the dummy die to the first side of the first substrate adjacent the integrated circuit die;
    forming a molding compound over the first substrate and surrounding the dummy die and the integrated circuit die, a top surface of the molding compound being substantially level with a topmost surface of the dummy die, a topmost surface of the first annular structure, and a topmost surface of the integrated circuit die;
    removing the first annular structure, the dummy die being separated into an interior region and a peripheral annular region after removing the first annular structure;
    detaching the interior region of the dummy die from the first substrate, the peripheral annular region of the dummy die forming a second annular structure;
    placing a functional component on the first side of the first substrate within the second annular structure; and
    attaching the functional component to the first side of the first substrate.

9. The method of claim 8, wherein forming the dummy die comprises:
    patterning a second substrate to form an opening in the second substrate, the opening having an annular shape in a plan view; and
    depositing an insulating material in the opening to form the first annular structure.

10. The method of claim 8, wherein removing the first annular structure comprises performing a laser drilling process.

11. The method of claim 8, wherein the dummy die is attached to the first side of the first substrate using an adhesive.

12. The method of claim 8, wherein the functional component and the second annular structure have different heights.

13. The method of claim 8, further comprising forming a plurality of connectors on a second side of the first substrate, the second side of the first substrate being opposite the first side of the first substrate.

14. The method of claim 8, wherein the first substrate comprises an interposer.

15. A method comprising:
   attaching a first integrated circuit die to a first side of a first substrate;
   attaching a second integrated circuit die to the first side of the first substrate adjacent the first integrated circuit die;
   forming a dummy die, the dummy die comprising:
      an interior region;
      a first annular structure surrounding the interior region; and
      a peripheral annular region surrounding the first annular structure;
   attaching the dummy die to a top surface of the second integrated circuit die;
   encapsulating the first integrated circuit die, the second integrated circuit die and the dummy die in a molding compound;
   planarizing the molding compound to expose a top surface of the dummy die, a top surface of the first annular structure and a top surface of the first integrated circuit die;
   removing the first annular structure;
   removing the interior region of the dummy die to expose the top surface of the second integrated circuit die;
   placing a functional component within the peripheral annular region of the dummy die; and
   electrically coupling the functional component to the second integrated circuit die.

16. The method of claim 15, wherein a height of the functional component is greater than a height of the first annular structure.

17. The method of claim 15, wherein the first annular structure comprises an insulating material.

18. The method of claim 15, wherein forming the dummy die comprises:
   etching a second substrate to form an opening in the second substrate, the opening having an annular shape in a plan view; and
   filling the opening with an insulating material to form the first annular structure.

19. The method of claim 18, wherein a ratio of a width of the opening to a depth of the opening is between about 0.35 and about 0.7.

20. The method of claim 15, wherein removing the first annular structure comprises etching the first annular structure.

* * * * *